United States Patent
Chen et al.

(10) Patent No.: US 10,749,549 B2
(45) Date of Patent: Aug. 18, 2020

(54) METHOD AND DEVICE IN USER EQUIPMENT AND BASE STATION FOR WIRELESS COMMUNICATION

(71) Applicant: Shanghai Langbo Communication Technology Company Limited, Shanghai (CN)

(72) Inventors: Jin-Hui Chen, Shanghai (CN); Xiaobo Zhang, Shanghai (CN)

(73) Assignee: SHANGHAI LANGBO COMMUNICATION TECHNOLOGY COMPANY LIMITED, Shanghai (CN)

( * ) Notice: Subject to any disclaimer, the term of this patent is extended or adjusted under 35 U.S.C. 154(b) by 0 days.

(21) Appl. No.: 16/172,686

(22) Filed: Oct. 26, 2018

(65) Prior Publication Data

US 2019/0149173 A1    May 16, 2019

(30) Foreign Application Priority Data

Oct. 27, 2017  (CN) .......................... 2017 1 1026088
Nov. 1, 2017   (CN) .......................... 2017 1 1056091

(51) Int. Cl.
  *H03M 13/13*  (2006.01)
  *H04L 1/00*   (2006.01)
  *H03M 13/11*  (2006.01)
  *H03M 13/00*  (2006.01)

(52) U.S. Cl.
  CPC ....... *H03M 13/13* (2013.01); *H03M 13/1105* (2013.01); *H03M 13/618* (2013.01); *H04L 1/0008* (2013.01); *H04L 1/0041* (2013.01); *H04L 1/0045* (2013.01); *H04L 1/0057* (2013.01); *H04L 1/0058* (2013.01)

(58) Field of Classification Search
  CPC ...................................... H03M 13/13
  USPC ................. 714/758, 763, 760, 762
  See application file for complete search history.

(56) References Cited

U.S. PATENT DOCUMENTS

| | | | |
|---|---|---|---|
| 2014/0208183 A1* | 7/2014 | Mahdavifar | .......... H04L 1/0041 714/755 |
| 2015/0058694 A1* | 2/2015 | El-Khamy | .............. G06F 11/10 714/758 |
| 2015/0358113 A1* | 12/2015 | Callard | ................. H04W 28/04 714/776 |

* cited by examiner

*Primary Examiner* — Fritz Alphonse
(74) *Attorney, Agent, or Firm* — Maschoff Brennan

(57) ABSTRACT

A method and device in user equipment and a base station for wireless communication is disclosed. The base station equipment sequentially generates a first information block including bits in a first sub-information-block and a second sub-information-block, performs first channel coding and transmits a first radio signal. The first bit block includes bits in the first information block, the first bit block is used as an input of the first channel coding, the value of the first sub-information-block is related to the number of padding bits, and the relative position of the first sub-information-block and the second sub-information-block in the first information block is related to the number of bits included in the first information block. The present disclosure utilizes the characteristics of serial decoding of a Polar code, and improves the decoding performance using padding bits as frozen bits through the internal indication of the code block.

20 Claims, 8 Drawing Sheets

METHOD AND DEVICE IN USER EQUIPMENT AND BASE STATION FOR WIRELESS COMMUNICATION

CROSS REFERENCE TO RELATED APPLICATION

This application claims the priority benefit of Chinese Patent Application Serial Number 201711056091.0, filed on Nov. 1, 2017, and 201711026088.4, filed on Oct. 27, 2017, the full disclosure of which is incorporated herein by reference.

BACKGROUND

Technical Field

The present disclosure relates to a method for transmitting radio signals in a wireless communication system, and in particular to a transmitting method and device for channel coding.

Related Art

Polar Codes are coding schemes first proposed by Professor Erdal Arikan from University of Birken in Turkey in 2008, which may realize the code construction method of the capacity of a symmetrical Binary input Distributed Memoryless Channel (B-DMC). At the 3rd Generation Partner Project (3GPP) RAN1#87 conference, the 3GPP determined the use of a Polar code scheme as a control channel coding scheme of the 5G Enhanced Mobile Broadband (eMBB) scenario.

In the traditional Long Term Evolution (LTE) system, different Downlink Control Information (DCI) formats correspond to different numbers of coded bits. User Equipment (UE) performs blind detection on the Physical Downlink Control Channel (PDCCH) carrying the DCI according to all possible DCI formats corresponding to the current transmission mode. The method of receiving the PDCCH causes the number of blind detections on the UE side to increase as the candidate item of the number of bits corresponding to the DCI increases.

SUMMARY

The inventors have found through researches that for a certain number of information bits, both the length of the input bit block corresponding to a channel code based on a polar code and the polar code used are fixed, and the only difference lies in the number of frozen bits. This feature of the polar code may be used to fill the DCI format of different lengths to the bit block of the same length for transmission, and the length corresponding to the DCI format may be obtained by the format identifier field in the DCI. In order to alleviate the burden of blind detection on the UE side, a distributed Cyclic Redundancy Check (CRC) bit is introduced into a channel code based on a polar code, thereby introducing interleaving the DCI bit prior to performing polar code coding. Therefore, an urgent problem to be solved is how to place the format identifier field in the DCI format to determine the number of padding bits as early as possible and use padding bits as frozen bits to improve decoding performance.

In view of the above problem, the present disclosure provides a scheme. It should be noted that, in the case of no conflict, the embodiments of the present disclosure and the features in the embodiments may be combined with each other arbitrarily. For example, embodiments in the base station of the present disclosure and the features in the embodiments may be applied to user equipment, and vice versa.

The present disclosure discloses a method in base station equipment for wireless communication, including:

generating a first information block including bits in M sub-information-blocks and Q padding bits, where the M is a positive integer greater than one, and the Q is an integer not less than zero;

performing first channel coding, wherein a first bit block is used for an input of the first channel coding, the first bit block includes bits in the first information block, and the first channel coding is based on a polar code;

transmitting a first radio signal, wherein the output of the first channel coding is used to generate the first radio signal;

wherein any one of the M sub-information-blocks consists of a positive integer number of bits, the first sub-information-block is a sub-information-block of the M first sub-information-blocks; the value of the first sub-information-block is related to the information format of the first information block, or the value of the first sub-information-block is related to the Q; the sequential relationship between the first bit in the first sub-information-block and the first bit in the second sub-information-block in the first information block is related to the number of bits included in the first information block, and the second sub-information-block is a sub-information-block of the M sub-information-blocks.

In one embodiment, the above method has the advantages that the position of the identifier field for indicating the DCI format in the DCI information block is adjusted according to the DCI format, thereby reducing the decoding delay and improving the decoding accuracy.

In one embodiment, the base station equipment assumes that the receiver of the first radio signal uses the Q padding bits as frozen bits in a channel decoding process.

In one embodiment, the Q ensures that the number of bits in the first information block is a target positive integer in the first candidate integer set, the target positive integer is a minimum positive integer not less than the total number of bits in the M sub-information-blocks in the first candidate integer set, and the first candidate integer set consists of a plurality of positive integers.

In one embodiment, the first candidate integer set is default (i.e., no signaling configuration is required).

In one embodiment, any positive integer in the first candidate integer set is no more than 200.

In one embodiment, the bits in the first sub-information-block are consecutive in the first information block, the bits in the second sub-information-block are consecutive in the first information block, and the sequential relationship between the first sub-information-block and the second sub-information-block in the first information block is related to the number of bits included in the first information block.

In one embodiment, the Q is 0, and the first information block consists of the M sub-information-blocks.

In one embodiment, the Q is greater than 0, and the values of the Q padding bits are set by default.

In one embodiment, the Q is greater than 0, and the value of the Q padding bits are all fixed to zero.

In one embodiment, the Q is greater than 0, and the values of the Q padding bits are set by default to be the same as the values of the frozen bits in the first bit block.

In one embodiment, the first information block is broadcast information, and the M sub-information-blocks correspond to M fields in the broadcast information, respectively.

In one embodiment, the first radio signal is transmitted on a Physical Broadcast Channel (PBCH).

In one embodiment, the first radio signal is transmitted on a Physical Downlink Control Channel (PDCCH).

In one embodiment, the first radio signal is transmitted on an Enhanced Physical Downlink Control Channel (EPDCCH).

In one embodiment, the first radio signal is transmitted on a physical control channel.

In one embodiment, the M sub-information-blocks correspond to M fields in the DCI, respectively.

In one embodiment, the first information block is a DCI related to the UL Grant.

In one embodiment, the first information block indicates control information related to uplink transmission.

In one embodiment, the first information block indicates a time-frequency resource for uplink transmission.

In one embodiment, the first information block indicates a modulation scheme for uplink transmission.

In one embodiment, the first information block indicates a coding scheme for uplink transmission.

In one embodiment, the first information quickly indicates a multi-antenna technical scheme for uplink transmission.

In one embodiment, the first information block is a DCI related to the UL Grant.

In one embodiment, the first information block indicates control information related to downlink transmission.

In one embodiment, the first information block indicates a time-frequency resource for downlink transmission.

In one embodiment, the first information block indicates a modulation scheme for downlink transmission.

In one embodiment, the first information block indicates a coding scheme for downlink transmission.

In one embodiment, the first information block indicates a multi-antenna technical scheme for downlink transmission.

In one embodiment, the first bit block includes a CRC bit, and bits in the first information block are used to generate the CRC.

In one embodiment, the first bit block includes a scrambled CRC, and bits in the first information block are used to generate the scrambled CRC.

In one embodiment, the scrambled CRC is generated after the CRC and the feature sequence are subjected to a scrambling operation.

In one embodiment, the scrambling operation is an exclusive OR operation.

In one embodiment, the feature sequence is specific to user equipment.

In one embodiment, the feature sequence is related to an identifier of user equipment.

In one embodiment, the feature sequence is an identifier of user equipment.

In one embodiment, the sequential order in which the bits in the first information block are in the first information block is different from the sequential order in which the bits in the first information block are in the first bit block.

In one embodiment, the first information block and the CRC are mapped into the first bit block after being interleaved.

In one embodiment, the first information block and the scrambled CRC are mapped into the first bit block after being interleaved.

In one embodiment, the CRC consists of 24 bits.

In one embodiment, the CRC consists of 16 bits.

In one embodiment, the scrambled CRC consists of 24 bits.

In one embodiment, the scrambled CRC consists of 16 bits.

In one embodiment, at least two consecutive bits in the first information block are distributed (i.e., non-consecutive) in the first bit block.

In one embodiment, the bits in the first information block are consecutive in the first bit block.

In one embodiment, the first bit block includes frozen bits.

In one embodiment, the values of the frozen bits are set by default.

In one embodiment, the first bit block does not include frozen bits. The first bit block and frozen bits are used for an input of the first channel coding.

In one embodiment, the first bit block is a result of interleaving a bit block obtained by cascading the first information block and CRC bits generated by the first information block.

In one embodiment, the first interleaving table is used to generate the first bit block based on interleaving the bit block obtained by cascading the first information block and CRC bits generated by the first information block.

In one embodiment, the first interleaving table is determined by default.

In one embodiment, the first bit block is the result of reordering the bits in the first information block and the CRC bits generated by the first information block.

In one embodiment, the first bit block is a result of mixing and reordering the bits in the first information block based on CRC bits and frozen bits generated by the first information block.

In one embodiment, the value of the first sub-information-block indicates an information format of the first information block.

In one embodiment, the information format of the first information block is a candidate format of K1 candidate formats, and the value of the first sub-information-block indicates the format of the first information block from the K1 candidate formats, where the K1 is a positive integer greater than one.

In one embodiment, the value of the first sub-information-block is a number of an information format of the first information block in K1 candidate formats, where the K1 is a positive integer greater than one.

In one embodiment, the value of the first sub-information-block is a binary number corresponding to the first sub-information-block.

In one embodiment, the value of the first sub-information-block is a decimal number corresponding to the first sub-information-block.

In one embodiment, the information format of the first information block is a candidate format of K1 candidate formats, and the value of the first sub-information-block in a certain numerical range is in one-to-one correspondence with the K1 candidate formats, where the K1 is a positive integer greater than one.

In one embodiment, the value of the first sub-information-block indicates the Q.

In one embodiment, the Q is a candidate value of K2 candidate values, and the value of the first sub-information-block indicates the Q from the K2 candidate values, where the K2 is a positive integer greater than 1.

In one embodiment, the value of the first sub-information-block is a number of the Q in K2 candidate values, where the K2 is a positive integer greater than one.

In one embodiment, the Q is a candidate value of K2 candidate values, and the value of the first sub-information-block in a certain numerical range is in one-to-one correspondence with K2 candidate formats, where the K2 is a positive integer greater than one.

In one embodiment, the information format of the first information block is used to determine the Q.

In one embodiment, the first information block is Downlink Control Information (DCI), and the information format of the first information block is a DCI format of the first information block.

In one embodiment, if the number of bits included in the first information block is Q1, the first sub-information-block is prior to the second sub-information-block; if the number of bits included in the first information block is Q2, the first sub-information-block is subsequent to the second sub-information-block; the Q1 and the Q2 are two different positive integers.

In one embodiment, if the number of bits included in the first information block is any positive integer in the first positive integer set, the first sub-information-block is prior to the second sub-information-block, and if the number of bits included in the first information block is any positive integer in the second positive integer set, the first sub-information-block is subsequent to the second sub-information-block; the first positive integer set and the second positive integer set consist of a plurality of positive integers, respectively.

In one embodiment, the second sub-information-block indicates Resource Assignment (RA).

In one embodiment, the second sub-information-block indicates a Resource Block (RB).

In one embodiment, the second sub-information-block is a Carrier Indicator Field (CIF) indicating a carrier.

In one embodiment, the second sub-information-block indicates a Modulation Coding Scheme (MCS).

In one embodiment, the second sub-information-block indicates a Redundancy Version (RV).

In one embodiment, the second sub-information-block is a field in which a New Data Indicator (NDI) is located.

In one embodiment, the second sub-information-block indicates multi-antenna-related configuration information.

According to an aspect of the present disclosure, including:

transmitting first information;

wherein the first information is used to determine the number of bits included in the first information block.

In one embodiment, the above method has the advantage of increasing the flexibility of the system.

In one embodiment, the first information explicitly indicates the number of bits included in the first information block.

In one embodiment, the first information implicitly indicates the number of bits included in the first information block.

In one embodiment, a physical downlink shared channel is used to transmit the first information.

In one embodiment, the first information is higher-layer signaling.

In one embodiment, the first information is semi-statically configured.

In one embodiment, the first information is Radio Resource Control (RRC) layer signaling.

In one embodiment, the use of the determination refers to an explicit indication.

In one embodiment, the use of the determination refers to an implicit indication.

In one embodiment, the first information implicitly indicates an information format of the first information block.

In one embodiment, the first information explicitly indicates an information format of the first information block.

In one embodiment, the first information is used to determine the information format set in which the information format of the first information block is located.

In one embodiment, the first information is used to determine the information format set in which the information format of the first information block is located, and the information format in the information format set includes the same number of bits.

In one embodiment, a physical downlink control channel is used to transmit the first information.

In one embodiment, the first information is dynamically configured.

In one embodiment, the first information includes related information of a carrier bandwidth configuration.

In one embodiment, the first information includes configuration information related to a Bandwidth Part (BWP).

In one embodiment, the first information includes information of a candidate time-frequency resource that may be used for a physical control channel.

In one embodiment, the information format of the first information block is a DCI format of the first information block.

In one embodiment, the first information is used to determine the M.

In one embodiment, the first information is used to determine the number of bits included in at least one of the M sub-information-blocks.

In one embodiment, the first information includes multiple-antenna-related configuration information.

In one embodiment, the first information includes CIF-related configuration information.

In one embodiment, the first information includes configuration information related to the transmission mode.

According to an aspect of the present disclosure, the first information block is formed by sequentially cascading the M sub-information-blocks and the Q padding bits.

In one embodiment, the above method has the advantage of facilitating specifying explicit definition and user equipment processing.

In one embodiment, the position of the first sub-information-block in the first information block is related to the number of bits included in the first information block.

In one embodiment, the bits in the first sub-information-block are consecutive on the first information block.

In one embodiment, the bits in the second sub-information-block are consecutive on the first information block.

In one embodiment, the information format of the first information block is one of K3 candidate formats, where the K3 is a positive integer greater than 1, and the K3 candidate formats include a first candidate format and a second candidate format; if the information format of the first information block is the first candidate format, the first sub-information-block is prior to the second sub-information-block, and if the information format of the first information block is the second candidate format, the first sub-information-block is subsequent to the second sub-information-block.

In one embodiment, if the information format of the first information block is the first candidate format, the number of bits included in the first information block is Q1; if the information format of the first information block is the second candidate format, the number of bits included in the first information block is Q2, where the Q1 and the Q2 are two different positive integers.

According to an aspect of the present disclosure, the position of the first sub-information-block in the first information block is an optimal position among N candidate positions, where the N is a positive integer greater than 1, correspondingly, the pattern of the bits in the first information block in the first information block is an optimal pattern among N candidate patterns, and the optimal pattern is a candidate pattern among the N candidate patterns meeting the following condition that:

the last bit occupied in the first bit block is front-most.

In one embodiment, the above method has the advantage that the DCI format can be determined as early as possible by decoding the format identifier field as early as possible by a serial decoder, thereby determining the number of padding bits as soon as possible and decoding the entire DCI using padding bits as frozen bits.

In one embodiment, the N is equal to the M, and the first sub-information-block is sequentially one of the M sub-information-blocks in one-to-one correspondence with the M candidate positions.

In one embodiment, the N is equal to the factorial of the M.

In one embodiment, the N is N candidate positions of the first sub-information-block in M1 possible arrangements of the M sub-information-blocks, where the M1 is a positive integer greater than 1.

In one embodiment, the M1 is a factorial of the M.

In one embodiment, the bits in the first bit block are arranged in sequence.

In one embodiment, the bit with the smallest sequence number in the first bit block is the front-most bit among the bits of the first bit block.

In one embodiment, the leftmost bit in the first bit block is the front-most bit among the bits of the first bit block.

In one embodiment, the least significant bit of the first bit block is the front-most bit among the bits of the first bit block.

In one embodiment, the bits in the first bit block are arranged in a first to last decoding order assumed by the base station equipment.

In one embodiment, the bits in the first bit block are arranged in an ascending order of reliability.

In one embodiment, the first bit block is multiplied by a Kronecker Matrix to obtain an output of the first channel coding.

According to an aspect of the present disclosure, the first sub-information-block consists of K bits, and at least two of the K bits are non-consecutive in the first information block, where the K is a positive integer greater than 1.

In one embodiment, the above method has the advantage that better decoding efficiency may be achieved if the bit field used to indicate the format is not necessarily continuously limited by the bits in the DCI bit block.

In one embodiment, the K is equal to 2.

In one embodiment, the K is equal to 3.

In one embodiment, the bits in the first sub-information-block are consecutive in the first bit block.

In one embodiment, the bits in the first sub-information-block are also non-consecutive in the first bit block.

In one embodiment, the bits in the first sub-information-block are highest ranked among the non-frozen bits in the first bit block.

According to an aspect of the present disclosure, the first bit block is formed by sequentially cascading a frozen bit block, a first bit sub-block and a second bit sub-block; the first bit sub-block consists of bits in the first sub-information-block, and the second bit sub-block includes bits in the first information bit block except the first sub-information-block.

In one embodiment, the above method has the advantage that the DCI format indication is first obtained by decoding to determine the number of padding bits, and the padding bits are used as frozen bits to improve decoding performance.

In one embodiment, the second bit sub-block includes a CRC bit.

In one embodiment, the second bit sub-block includes a scrambled CRC bit.

In one embodiment, the first bit sub-block is generated after interleaving the first sub-information-block.

In one embodiment, the second bit sub-block is a bit block except the bits in the first sub-information-block generated after interleaving the bits in the first information bit block except the first sub-information-block and the scrambled CRC bits.

According to an aspect of the present disclosure, the first information block is downlink control information, the information format of the first information block is a downlink control information format of the first information block, and the M sub-information-blocks correspond to M fields in the downlink control information, respectively.

In one embodiment, the above method has the advantage that the format flag indication field is adapted to transmit downlink control information to improve transmission efficiency and decoding performance of the downlink control information.

In one embodiment, the downlink control information is related to downlink transmission.

In one embodiment, the downlink control information is related to uplink transmission.

In one embodiment, there are a plurality of the downlink control information formats, and the downlink control information format of the first information block is one of the downlink control information formats.

In one embodiment, the M fields indicate different content.

The present disclosure discloses a method in user equipment for wireless communication, including:

receiving a first radio signal, wherein the first radio signal is used for an input of first channel decoding;

performing first channel decoding, wherein the first channel decoding corresponds to first channel coding, the first channel coding is based on a polar code, and a first bit block is used for an input of the first channel coding;

recovering a first information block, wherein the first bit block includes bits in the first information block, the first information block includes bits in M sub-information-blocks and Q padding bits, where the M is a positive integer greater than one, and the Q is an integer not less than zero;

wherein any one of the M sub-information-blocks consists of a positive integer number of bits, the first sub-information-block is a sub-information-block of the M first sub-information-blocks; the value of the first sub-information-block is related to the information format of the first information block, or the value of the first sub-information-block is related to the Q; the sequential relationship between the first bit in the first sub-information-block and the first bit in the second sub-information-block in the first information block is related to the number of bits included in the first information block, and the second sub-information-block is a sub-information-block of the M sub-information-blocks.

In one embodiment, the first channel decoding is serial channel decoding.

In one embodiment, the first channel decoding is used to recover the first bit block.

In one embodiment, the first channel decoding is used to recover soft bits corresponding to the first bit block.

In one embodiment, bit reordering is extracted from the first bit block to recover the first information block.

In one embodiment, the first bit block is deinterleaved to recover the first information block.

In one embodiment, the first channel decoding recovers bits in the first sub-information-block prior to restoring all bits in the first information block.

In one embodiment, the bits in the first sub-information-block are used by the first channel decoding to recover bits in the first information block.

In one embodiment, after the first channel decoding is used to recover bits in the first sub-information-block, the user equipment continues to use the first channel decoding for decoding with the Q padding bits indicated by the first sub-information-block as frozen bits, thereby recovering the bits in the first information block.

In one embodiment, after the first channel decoding is used to recover bits in the first sub-information-block, the user equipment continues to use the first channel decoding for decoding with its corresponding Q padding bits as frozen bits according to the information format of the first information block indicated by the first sub-information-block, thereby recovering the bits in the first information block.

According to an aspect of the present disclosure, including:

receiving first information;

wherein the first information is used to determine the number of bits included in the first information block.

According to an aspect of the present disclosure, the first information block is formed by sequentially cascading the M sub-information-blocks and the Q padding bits.

According to an aspect of the present disclosure, the position of the first sub-information-block in the first information block is an optimal position among N candidate positions, where the N is a positive integer greater than 1, correspondingly, the pattern of the bits in the first information block in the first information block is an optimal pattern among N candidate patterns, and the optimal pattern is a candidate pattern among the N candidate patterns meeting the following condition that:

the last bit occupied in the first bit block is front-most.

According to an aspect of the present disclosure, the first sub-information-block consists of K bits, at least two of the K bits are non-consecutive in the first information block, where the K is a positive integer greater than 1.

According to an aspect of the present disclosure, the first bit block is formed by sequentially cascading a frozen bit block, a first bit sub-block and a second bit sub-block; the first bit sub-block consists of bits in the first sub-information-block, and the second bit sub-block includes bits in the first information bit block except the first sub-information-block.

In one embodiment, the bits in the first bit sub-block are obtained by being decoded by the first channel decoding prior to the bits in the second bit sub-block.

According to an aspect of the present disclosure, the first information block is downlink control information, the information format of the first information block is a downlink control information format of the first information block, and the M sub-information-blocks correspond to M fields in the downlink control information, respectively.

The present disclosure discloses base station equipment for wireless communication, including:

a first processor module configured to generate a first information block including bits in M sub-information-blocks and Q padding bits, where the M is a positive integer greater than one, and the Q is an integer not less than zero;

a first channel encoder configured to perform first channel coding, wherein a first bit block is used for an input of the first channel coding, the first bit block includes bits in the first information block, and the first channel coding is based on a polar code;

a first transmitter module configured to transmit a first radio signal, wherein the output of the first channel coding is used to generate the first radio signal;

wherein any one of the M sub-information-blocks consists of a positive integer number of bits, the first sub-information-block is a sub-information-block of the M first sub-information-blocks; the value of the first sub-information-block is related to the information format of the first information block, or the value of the first sub-information-block is related to the Q; the sequential relationship between the first bit in the first sub-information-block and the first bit in the second sub-information-block in the first information block is related to the number of bits included in the first information block, and the second sub-information-block is a sub-information-block of the M sub-information-blocks.

In one embodiment, the above base station equipment is characterized in that the first transmitter module transmits first information; wherein the first information is used to determine the number of bits included in the first information block.

In one embodiment, the above base station equipment is characterized in that the first information block is formed by sequentially cascading the M sub-information-blocks and the Q padding bits.

In one embodiment, the above base station equipment is characterized in that the position of the first sub-information-block in the first information block is an optimal position among N candidate positions, where the N is a positive integer greater than 1, correspondingly, the pattern of the bits in the first information block in the first information block is an optimal pattern among N candidate patterns, and the optimal pattern is a candidate pattern among the N candidate patterns meeting the following condition that:

the last bit occupied in the first bit block is front-most.

In one embodiment, the above base station equipment is characterized in that the first sub-information-block consists of K bits, at least two of the K bits are non-consecutive in the first information block, where the K is a positive integer greater than 1.

In one embodiment, the above base station equipment is characterized in that the first bit block is formed by sequentially cascading a frozen bit block, a first bit sub-block and a second bit sub-block; the first bit sub-block consists of bits in the first sub-information-block, and the second bit sub-block includes bits in the first information bit block except the first sub-information-block.

In one embodiment, the above base station equipment is characterized in that the first information block is downlink control information, the information format of the first information block is a downlink control information format of the first information block, and the M sub-information-blocks correspond to M fields in the downlink control information, respectively.

The present disclosure discloses user equipment for wireless communication, including:

a first receiver module configured to receive a first radio signal, wherein the first radio signal is used for an input of first channel decoding;

a first channel decoder configured to perform first channel decoding, wherein the first channel decoding corresponds to first channel coding, the first channel coding is based on a polar code, and a first bit block is used for an input of the first channel coding;

a second processor module configured to recover a first information block, wherein the first bit block includes bits in the first information block, the first information block includes bits in M sub-information-blocks and Q padding bits, where the M is a positive integer greater than one, and the Q is an integer not less than zero;

wherein any one of the M sub-information-blocks consists of a positive integer number of bits, the first sub-information-block is a sub-information-block of the M first sub-information-blocks; the value of the first sub-information-block is related to the information format of the first information block, or the value of the first sub-information-block is related to the Q; the sequential relationship between the first bit in the first sub-information-block and the first bit in the second sub-information-block in the first information block is related to the number of bits included in the first information block, and the second sub-information-block is a sub-information-block of the M sub-information-blocks.

In one embodiment, the above user equipment is characterized in that the first receiver module receives first information; wherein the first information is used to determine the number of bits included in the first information block.

In one embodiment, the above user equipment is characterized in that the first information block is formed by sequentially cascading the M sub-information-blocks and the Q padding bits.

In one embodiment, the above user equipment is characterized in that the position of the first sub-information-block in the first information block is an optimal position among N candidate positions, where the N is a positive integer greater than 1, correspondingly, the pattern of the bits in the first information block in the first information block is an optimal pattern among N candidate patterns, and the optimal pattern is a candidate pattern among the N candidate patterns meeting the following condition that:

the last bit occupied in the first bit block is front-most.

In one embodiment, the above user equipment is characterized in that the first sub-information-block consists of K bits, at least two of the K bits are non-consecutive in the first information block, where the K is a positive integer greater than 1.

In one embodiment, the above user equipment is characterized in that the first bit block is formed by sequentially cascading a frozen bit block, a first bit sub-block and a second bit sub-block; the first bit sub-block consists of bits in the first sub-information-block, and the second bit sub-block includes bits in the first information bit block except the first sub-information-block.

In one embodiment, the above user equipment is characterized in that the first information block is downlink control information, the information format of the first information block is a downlink control information format of the first information block, and the M sub-information-blocks correspond to M fields in the downlink control information, respectively.

In one embodiment, the present disclosure has the following advantages over the conventional scheme:

using the characteristics of the Polar code serial decoding to reduce the number of blind detections on the UE side by the internal indication of the code block;

supporting more flexible and diverse DCI formats;

using padding bits as frozen bits to improve decoding performance;

optimizing system performance by optimizing the position of the indication information of the information format.

BRIEF DESCRIPTION OF THE DRAWINGS

Other features, objects and advantages of the present disclosure will become more apparent from the detailed description of non-restrictive embodiments taken in conjunction with the following drawings.

DESCRIPTION OF THE EMBODIMENTS

The technical schemes of the present disclosure will be further described in detail below with reference to the accompanying drawings. It should be noted that the embodiments of the present disclosure and the features in the embodiments may be combined with each other without conflict.

Embodiment 1

Figure 1:
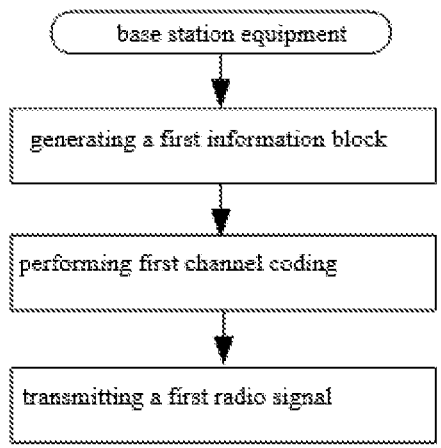
FIG. 1 illustrates a flow chart of a first information block, first channel coding and a first radio signal according to one embodiment of the present disclosure.

Embodiment 1 illustrates a first information block, first channel coding and a first radio signal according to the present disclosure, as shown in FIG. 1. In FIG. 1, each block represents a step. In Embodiment 1, the base station equipment in the present disclosure sequentially generates a first information block, performs first channel coding, and transmits a first radio signal; wherein the first information block includes bits in M sub-information-blocks and Q padding bits, where the M is a positive integer greater than 1, and the Q is an integer not less than 0; a first bit block is used for an input of the first channel coding, the first bit block includes bits in the first information block, the first channel coding is based on a polar code; an output of the first channel coding is used to generate the first radio signal; any one of the M sub-information-blocks consists of a positive integer number of bits, the first sub-information-block is a sub-information-block of the M first sub-information-blocks; the value of the first sub-information-block is related to the information format of the first information block, or the value of the first sub-information-block is related to the Q; the sequential relationship between the first bit in the first sub-information-block and the first bit in the second sub-information-block in the first information block is related to the number of bits included in the first information block, and the second sub-information-block is a sub-information-block of the M sub-information-blocks.

In one embodiment, the first information block is a DCI block.

In one embodiment, a PDCCH is used to transmit the first information block.

In one embodiment, the first sub-information-block indicates an information format of the first information block, and the information format of the first information block is used to determine the Q.

In one embodiment, the sequential order in which the bits in the first information block are in the first information block is different from the sequential order in which the bits in the first information block are in the first bit block.

In one embodiment, if the number of bits included in the first information block is Q1, the first bit of the first sub-information-block is prior to the first bit of the second sub-information-block; if the number of bits included in the first information block is Q2, the first bit of the first sub-information-block is subsequent to the first bit of the second sub-information-block; the Q1 and the Q2 are two different positive integers.

In one embodiment, the second sub-information-block indicates time-frequency resource information occupied by the downlink transmission.

In one embodiment, the second sub-information-block indicates time-frequency resource information occupied by the uplink transmission.

In one embodiment, the first sub-information-block consists of 2 bits.

In one embodiment, the first sub-information-block consists of 3 bits.

In one embodiment, the first sub-information-block consists of 4 bits.

Embodiment 2

Figure 2:
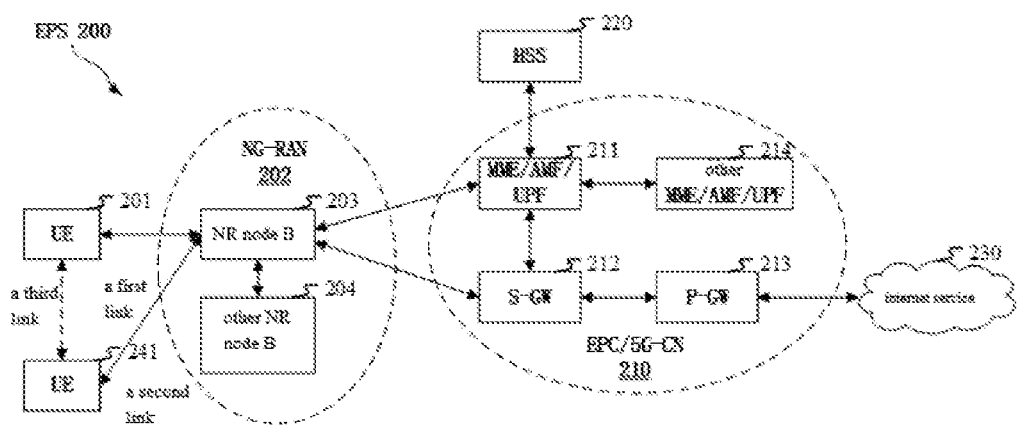
FIG. 2 illustrates a schematic diagram of a network architecture according to one embodiment of the present disclosure.

Embodiment 2 illustrates a schematic diagram of a network architecture according to the present disclosure, as shown in FIG. 2. FIG. 2 illustrates a diagram of a system network architecture 200 of NR 5G, Long-Term Evolution (LTE), and Long-Term Evolution Advanced (LTE-A). The NR 5G or LTE network architecture 200 may be referred to as an Evolved Packet System (EPS) 200 or other appropriate terms. The EPS 200 may include one or more of User Equipment (UE) 201, a Next Generation Radio Access Network (NG-RAN) 202, an Evolved Packet Core (EPC)/5G-Core Network (5G-CN) 210, a Home Subscriber Server (HSS) 220 and an Internet Service 230. The EPS may be interconnected with other access networks. For simple description, the entities/interfaces are not shown. As shown in the figure, the EPS provides packet switching services. Those skilled in the art are easy to understand that various concepts presented throughout the present disclosure can be extended to networks providing circuit switching services or other cellular networks. The NG-RAN includes an NR node B (gNB) 203 and other gNBs 204. The gNB 203 provides UE 201 oriented user plane and control plane protocol terminations. The gNB 203 may be connected to other gNBs 204 via an Xn interface (for example, backhaul). The gNB 203 may be called a base station, a base transceiver station, a radio base station, a radio transceiver, a transceiver function, a Basic Service Set (BSS), an Extended Service Set (ESS), a Transmitter Receiver Point (TRP) or other appropriate terms. The gNB 203 provides an access point of the EPC/5G-CN 210 for the UE 201. Examples of UE 201 include cellular phones, smart phones, Session Initiation Protocol (SIP) phones, laptop computers, Personal Digital Assistants (PDAs), Satellite Radios, Global Positioning Systems (GPSs), multimedia devices, video devices, digital audio player (for example, MP3 players), cameras, games consoles, unmanned aerial vehicles, air vehicles, narrowband physical network equipment, machine-type communication equipment, land vehicles, automobiles, wearable equipment, or any other devices having similar functions. Those skilled in the art also can call the UE 201 a mobile station, a subscriber station, a mobile unit, a subscriber unit, a wireless unit, a remote unit, a mobile device, a wireless device, a radio communication device, a remote device, a mobile subscriber station, an access terminal, a mobile terminal, a wireless terminal, a remote terminal, a handset, a user proxy, a mobile client, a client or other appropriate terms. The gNB 203 is connected to the EPC/5G-CN 210 via an S1/NG interface. The EPC/5G-CN 210 includes an MME/AMF/UPF 211, other MME/AMF/UPFs 214, a Service Gateway (S-GW) 212 and a Packet Data Network Gateway (P-GW) 213. The MME/AMF/UPF 211 is a control node for processing a signaling between the UE 201 and the EPC/5G-CN 210. Generally, the MME/AMF/UPF 211 provides bearer and connection management. All user Internet Protocol (IP) packets are transmitted through the S-GW 212. The S-GW 212 is connected to the P-GW 213. The P-GW 213 provides UE IP address allocation and other functions. The P-GW 213 is connected to the Internet service 230. The Internet service 230 includes IP services corresponding to operators, specifically including Internet, Intranet, IP Multimedia Subsystems (IP IMSs) and Packet Switching Streaming Services (PSSs).

In one embodiment, the UE 201 corresponds to the UE in the present disclosure.

In one embodiment, the gNB 203 corresponds to the base station in the present disclosure.

In one embodiment, the UE 201 supports polar code decoding.

In one embodiment, the gNB 203 supports polar code coding.

Embodiment 3

Figure 3:
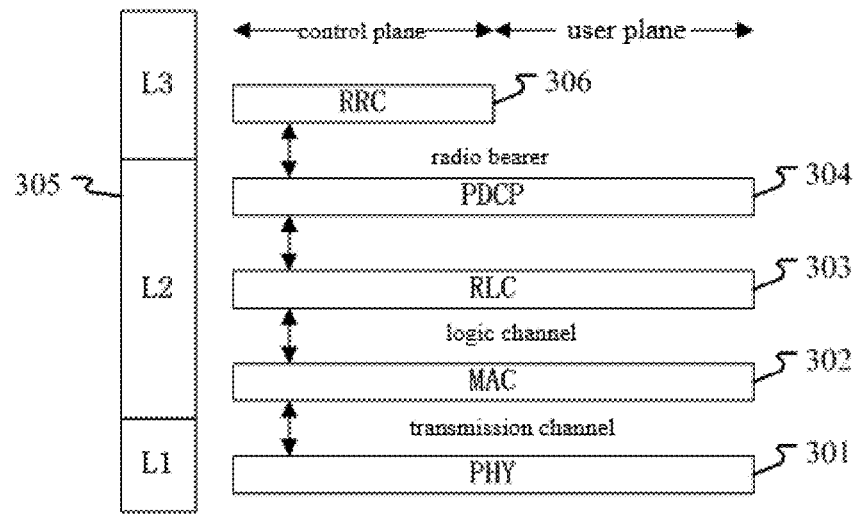
FIG. 3 illustrates a schematic diagram of a radio protocol architecture of a user plane and a control plane according to one embodiment of the present disclosure.

Embodiment 3 illustrates a schematic diagram of a radio protocol architecture of a user plane and a control plane according to the present disclosure, as shown in FIG. 3. FIG. 3 illustrates a schematic diagram of a radio protocol architecture of a user plane and a control plane. In FIG. 3, the radio protocol architecture of user equipment (UE) and Base Station Equipment (gNB or eNB) is represented by three layers, which are a layer 1, a layer 2 and a layer 3 respectively. The layer 1 (L1) 301 is the lowest layer and performs signal processing functions of each PHY layer. The layer 1 is called PHY 301 in this paper. The layer 2 (L2) 305 is above the PHY 301, and is in charge of the link between the UE and the gNB via the PHY 301. In the user plane, the L2 305 includes a Medium Access Control (MAC) sublayer 302, a Radio Link Control (RLC) sublayer 303, and a Packet Data Convergence Protocol (PDCP) sublayer 304. All the three sublayers terminate at the gNB of the network side. Although not described in FIG. 3, the UE may include several higher layers above the L2 305, such as a network layer (i.e. IP layer) terminated at a P-GW of the network side and an application layer terminated at the other side of the connection (i.e. a peer UE, a server, etc.). The PDCP sublayer 304 provides multiplexing among variable radio bearers and logical channels. The PDCP sublayer 304 also provides a header compression for a higher-layer packet so as to reduce a radio transmission overhead. The PDCP sublayer 304 provides security by encrypting a packet and provides support for UE handover between gNBs. The RLC sublayer 303 provides segmentation and reassembling of a higher-layer packet, retransmission of a lost packet, and reordering of a lost packet to as to compensate the disordered receiving caused by Hybrid Automatic Repeat Request (HARQ). The MAC sublayer 302 provides multiplexing between logical channels and transport channels. The MAC sublayer 302 is also responsible for allocating between UEs various radio resources (i.e., resource block) in a cell. The MAC sublayer 302 is also in charge of HARQ operation. In the control plane, the radio protocol architecture of the UE and the gNB is almost the same as the radio protocol architecture in the user plane on the PHY 301 and the L2 305, but there is no header compression function for the control plane. The control plane also includes a Radio Resource Control (RRC) sublayer 306 in the layer 3 (L3). The RRC sublayer 306 is responsible for acquiring radio resources (i.e. radio bearer) and configuring the lower layers using an RRC signaling between the gNB and the UE.

In one embodiment, the radio protocol architecture in FIG. 3 is applicable to the UE in the present disclosure.

In one embodiment, the radio protocol architecture in FIG. 3 is applicable to the base station equipment in the present disclosure.

In one embodiment, the first radio signal in the present disclosure is generated by the PHY 301.

In one embodiment, the first information in the present disclosure is generated by the PHY 301.

Embodiment 4

Figure 4:
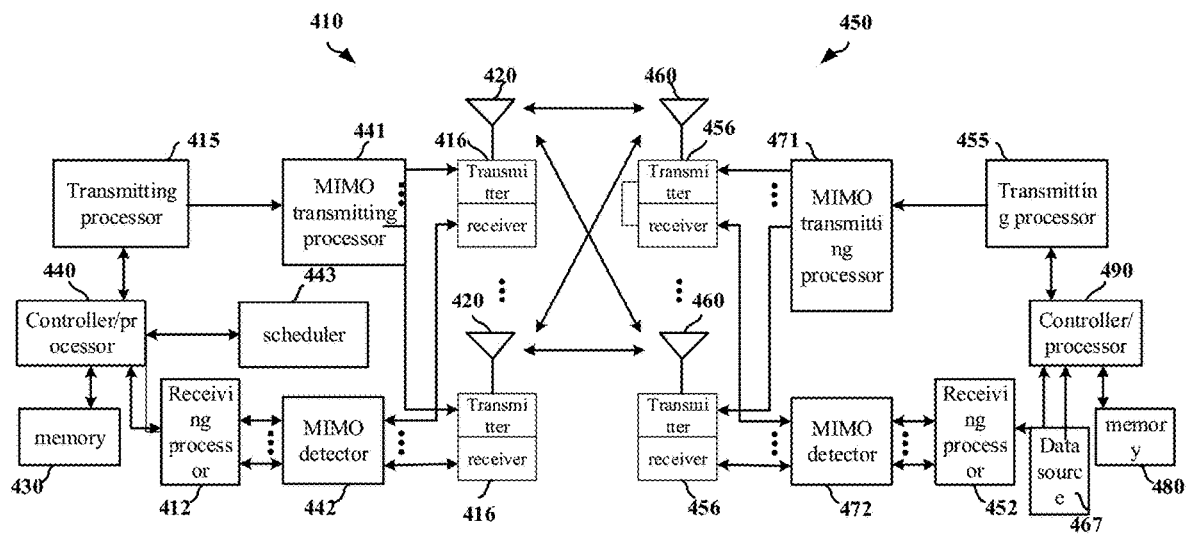
FIG. 4 illustrates a schematic diagram of an evolved node and a given user equipment according to one embodiment of the present disclosure.

Embodiment 4 shows a schematic diagram of base station equipment and given user equipment according to the present disclosure, as shown in FIG. 4. FIG. 4 is a block diagram of a gNB 410 in communication with UE 450 in an access network.

The base station equipment (410) may include a controller/processor 440, a scheduler 443, a memory 430, a receiving processor 412, a transmitting processor 415, a MIMO transmitting processor 441, a MIMO detector 442, a transmitter/receiver 416 and an antenna 420.

The user equipment (UE 450) may include a controller/processor 490, a memory 480, a data source 467, a transmitting processor 455, a receiving processor 452, a MIMO transmitting processor 471, a MIMO detector 472, a transmitter/receiver 456, and an antenna 460.

In the downlink transmission, the processing related to the base station equipment (410) may include the following steps:

the upper-layer packet arrives at the controller/processor 440, which provides packet header compression, encryption, packet segmentation and reordering, and multiplexing and demultiplexing between the logical and transport channels for implementing the L2 layer protocol for the user plane and the control plane; the upper-layer packet may include data or control information, such as a Downlink Shared Channel (DL-SCH);

the controller/processor 440 may be associated with a memory 430 that stores program codes and data, the memory 430 may be a computer-readable medium;

the controller/processor 440 notifies the scheduler 443 of the transmission request, and the scheduler 443 is configured to schedule the air interface resource corresponding to the transmission requirement and notify the controller/processor 440 of the scheduling result;

the controller/processor 440 transmits the control information for the downlink transmission obtained in such a way that the receiving processor 412 processes the uplink receiving to the transmitting processor 415;

the transmitting processor 415 receives the output bit stream of controller/processor 440, and implements various signal transmission processing functions for the L1 layer (i.e., the physical layer) including coding, interleaving, scrambling, modulating, power control/allocation, and generates physics layer control signaling (including a PBCH, a PDCCH, a PHICH, a PCFICH, a reference signal), etc.;

the MIMO transmitting processor 441 performs spatial processing of data symbols, control symbols or reference signal symbols (such as multi-antenna precoding, digital beamforming), and outputs baseband signals to the transmitter 416;

the MIMO transmitting processor 441 outputs an analog transmitting beamforming vector to the transmitter 416;

the transmitter 416 is configured to convert the baseband signals provided by the MIMO transmitting processor 441 into radio frequency signals and transmit the signals via the antenna 420; each transmitter 416 samples the respective input symbol streams to obtain respective sampled signal streams; each transmitter 416 performs further processing (such as digital to analog conversion, amplification, filtering, upconversion, etc.) on the respective sampling streams to obtain downlink signals; the analog transmitting beamforming is processed in the transmitter 416.

In the downlink transmission, the processing related to the user equipment (UE 450) may include the following steps:

the receiver 456 is configured to convert radio frequency signals received through the antenna 460 into baseband signals and provide the signals to the MIMO detector 472; the analog receiving beamforming is processed in the receiver 456;

the MIMO detector 472 is configured to perform MIMO detection on the signal received from the receiver 456 and provide baseband signals that have been subjected to MIMO detection to the receiving processor 452;

the receiving processor 452 is configured to extract parameters related to the analog receiving beamforming and output the parameters to the MIMO detector 472, and the MIMO detector 472 outputs the analog receiving beamforming vector to the receiver 456;

the receiving processor 452 implements various signal transmission processing functions for the L1 layer (i.e., the physical layer) including decoding, deinterleaving, descrambling, demodulating, and physical layer control signaling extraction, etc.

the controller/processor 490 receives the bit stream output by the receiving processor 452, and provides packet header decompression, decryption, packet segmentation and reordering, and multiplexing and demultiplexing between the logical and transport channels for implementation the L2 layer protocol for the user plane and the control plane;

the controller/processor 490 may be associated with a memory 480 that stores program codes and data, the memory 480 may be a computer-readable medium;

the controller/processor 490 transmits the control information for the downlink receiving obtained in such a way that the transmitting processor 455 processes the uplink transmission to the receiving processor 452.

The first sub-information-block, the first information block, the first bit block and the first radio signal in the present disclosure are sequentially generated by the transmitting processor 415. The MIMO transmitting processor 441 performs multi-antenna precoding on the baseband signal related to the first radio signal output by the transmitting processor 415. The transmitter 416 converts the baseband signal provided by the MIMO transmitting processor 441 into a radio frequency signal, performs analog transmitting beamforming, and transmits the signal via the antenna 420. The receiver 456 will receive the signal through the antenna 460, perform analog receiving beamforming, obtain a radio frequency signal related to the first radio signal, convert the signal into a baseband signal and provide the baseband signal to the MIMO detector 472. The MIMO detector 472 performs MIMO detection on the signal received from the receiver 456. The receiving processor 452 processes the baseband signal output by the MIMO detector 472 to sequentially obtain the first radio signal, the first sub-information-block, the first bit block and the first information block.

The first information in the present disclosure is generated by the transmitting processor 415. The MIMO transmitting processor 441 performs multi-antenna precoding on the baseband signal related to the first information output by the transmitting processor 415. The transmitter 416 converts the baseband signal provided by the MIMO transmitting processor 441 into a radio frequency signal, performs analog transmitting beamforming, and transmits the signal via the antenna 420. The receiver 456 will receive the signal through the antenna 460, perform analog receiving beamforming, obtain a radio frequency signal related to the first information, convert the signal into a baseband signal and provide the baseband signal to the MIMO detector 472. The MIMO detector 472 performs MIMO detection on the signal received from the receiver 456. The receiving processor 452 processes the baseband signal output by the MIMO detector 472 to obtain the first information.

In the uplink transmission, the processing related to the user equipment (UE 450) may include the following steps:

The data source 467 provides an upper-layer packet to controller/processor 490, which provides packet header compression, encryption, packet segmentation and reordering, and multiplexing and demultiplexing between the logical and transport channels for implementing the L2 layer protocol for the user plane and the control plane; the upper-layer packet may include data or control information, such as a Uplink Shared Channel (UL-SCH);

the controller/processor 490 may be associated with a memory 480 that stores program codes and data, the memory 480 may be a computer-readable medium;

the controller/processor 490 transmits the control information for the uplink transmission obtained in such a way that the receiving processor 452 processes the downlink receiving to the transmitting processor 455;

the transmitting processor 455 receives the output bit stream of controller/processor 490, and implements various signal transmission processing functions for the L1 layer (i.e., the physical layer) including coding, interleaving, scrambling, modulating, power control/allocation, and generates physics layer control signaling (including a PBCH, a PDCCH, a PHICH, a PCFICH, a reference signal), etc.;

the MIMO transmitting processor 471 performs spatial processing of data symbols, control symbols or reference signal symbols (such as multi-antenna precoding, digital beamforming), and outputs baseband signals to the transmitter 456;

the MIMO transmitting processor 471 outputs an analog transmitting beamforming vector to the transmitter 456;

the transmitter 456 is configured to convert the baseband signals provided by the MIMO transmitting processor 471 into radio frequency signals and transmit the signals via the antenna 460; each transmitter 456 samples the respective input symbol streams to obtain respective sampled signal streams; each transmitter 456 performs further processing (such as digital to analog conversion, amplification, filtering, upconversion, etc.) on the respective sampling streams to obtain uplink signals; the analog transmitting beamforming is processed in the transmitter 456.

In the uplink transmission, the processing related to the base station equipment (410) may include the following steps:

the receiver 456 is configured to convert radio frequency signals received through the antenna 420 into baseband signals and provide the signals to the MIMO detector 442; the analog receiving beamforming is processed in the receiver 416;

the MIMO detector 442 is configured to perform MIMO detection on the signal received from the receiver 416 and provide baseband signals that have been subjected to MIMO detection to the receiving processor 442;

the MIMO detector 442 outputs an analog receiving beamforming vector to the receiver 416;

the receiving processor 412 implements various signal transmission processing functions for the L1 layer (i.e., the physical layer) including decoding, deinterleaving, descrambling, demodulating, and physical layer control signaling extraction, etc.

the controller/processor 440 receives the bit stream output by the receiving processor 412, provides packet header decompression, decryption, packet segmentation and reordering, and multiplexing and demultiplexing between the logical and transport channels for implementation the L2 layer protocol for the user plane and the control plane;

the controller/processor 440 may be associated with a memory 430 that stores program codes and data, the memory 430 may be a computer-readable medium;

the controller/processor 440 transmits the control information for the uplink transmission obtained in such a way that the transmitting processor 415 processes the downlink receiving to the receiving processor 412.

In one embodiment, the gNB 410 device includes: at least one processor and at least one memory, wherein the at least one memory includes a computer program code; the at least one memory and the computer program code are configured to be used together with the at least one processor. The gNB 410 device at least: generates a first information block including bits in M sub-information-blocks and Q padding bits, where the M is a positive integer greater than one, and the Q is an integer not less than zero; performs first channel coding, wherein a first bit block is used for an input of the first channel coding, the first bit block includes bits in the first information block, and the first channel coding is based on a polar code; transmits a first radio signal, wherein the output of the first channel coding is used to generate the first radio signal; wherein any one of the M sub-information-blocks consists of a positive integer number of bits, the first sub-information-block is a sub-information-block of the M first sub-information-blocks; the value of the first sub-information-block is related to the information format of the first information block, or the value of the first sub-information-block is related to the Q; the sequential relationship between the first bit in the first sub-information-block and the first bit in the second sub-information-block in the first information block is related to the number of bits included in the first information block, and the second sub-information-block is a sub-information-block of the M sub-information-blocks.

In one embodiment, the gNB 410 includes: a memory in which a computer-readable instruction program is stored, wherein the computer-readable instruction program generates an action when executed by at least one processor, the action includes: generating a first information block including bits in M sub-information-blocks and Q padding bits, where the M is a positive integer greater than one, and the Q is an integer not less than zero; performing first channel coding, wherein a first bit block is used for an input of the first channel coding, the first bit block includes bits in the first information block, and the first channel coding is based on a polar code; transmitting a first radio signal, wherein the output of the first channel coding is used to generate the first radio signal; wherein any one of the M sub-information-blocks consists of a positive integer number of bits, the first sub-information-block is a sub-information-block of the M first sub-information-blocks; the value of the first sub-information-block is related to the information format of the first information block, or the value of the first sub-information-block is related to the Q; the sequential relationship between the first bit in the first sub-information-block and the first bit in the second sub-information-block in the first information block is related to the number of bits included in the first information block, and the second sub-information-block is a sub-information-block of the M sub-information-blocks.

In one embodiment, the UE 450 device includes: at least one processor and at least one memory, wherein the at least one memory includes a computer program code; the at least one memory and the computer program code are configured to be used together with the at least one processor. The UE 450 device includes: receiving a first radio signal, wherein the first radio signal is used for an input of first channel decoding; performing first channel decoding, wherein the first channel decoding corresponds to first channel coding, the first channel coding is based on a polar code, and a first bit block is used for an input of the first channel coding; recovering a first information block, wherein the first information block includes K bits consisting of bits in M sub-information-blocks and Q padding bits, the first bit block includes the K bits and L check bits, the first information block is used to generate the L check bits, where the M and the K are both positive integers greater than 1, the Q is a non-negative integer, and the L is a positive integer; wherein any one of the M sub-information-blocks consists of a positive integer number of bits, the first sub-information-block is a sub-information-block of the M first sub-information-blocks, the first sub-information-block consists of P bits, where the P is a positive integer; the value of the first sub-information-block is related to the information format of the first information block, or the value of the first sub-information-block is related to the Q; the first information block and the L check bits are sequentially mapped to the first bit block after being interleaved, the positions of the P bits in the first bit block are all prior to the first check bit, the first check bit is the front-most check bit of the L check bits in the first bit block, and both the previous adjacent bit and the next adjacent bit of the first check bit in the first bit block are bits in the first information block.

In one embodiment, the UE 450 includes: a memory in which a computer-readable instruction program is stored, wherein the computer-readable instruction program generates an action when executed by at least one processor, the action includes: receiving a first radio signal, wherein the first radio signal is used for an input of first channel decoding; performing first channel decoding, wherein the first channel decoding corresponds to first channel coding, the first channel coding is based on a polar code, and a first bit block is used for an input of the first channel coding; recovering a first information block, wherein the first information block includes K bits consisting of bits in M sub-information-blocks and Q padding bits, the first bit block includes the K bits and L check bits, the first information block is used to generate the L check bits, where the M and the K are both positive integers greater than 1, the Q is a non-negative integer, and the L is a positive integer; wherein any one of the M sub-information-blocks consists of a positive integer number of bits, the first sub-information-block is a sub-information-block of the M first sub-information-blocks, the first sub-information-block consists of P bits, where the P is a positive integer; the value of the first sub-information-block is related to the information format of the first information block, or the value of the first sub-information-block is related to the Q; the first information block and the L check bits are sequentially mapped to the first bit block after being interleaved, the positions of the P bits in the first bit block are all prior to the first check bit, the first check bit is the front-most check bit of the L check bits in the first bit block, and both the previous adjacent bit and the next adjacent bit of the first check bit in the first bit block are bits in the first information block.

In one embodiment, the gNB 410 corresponds to the base station in the present disclosure.

In one embodiment, the UE 450 corresponds to the user equipment in the present disclosure.

In one embodiment, a transmitting processor 415, a MIMO transmitter 441, and a transmitter 416 are used to transmit the first radio signal in the present disclosure.

In one embodiment, a receiver 456, a MIMO detector 472, and a receiving processor 452 are used to receive the first radio signal in the present disclosure.

In one embodiment, the transmitting processor 415 is used to generate a first information block.

In one embodiment, the receiving processor 452 is used to recover the first information block.

In one embodiment, the transmitting processor 415 is used to perform the first channel coding.

In one embodiment, the receiving processor 452 is configured to perform first channel decoding.

Embodiment 5

Figure 5:
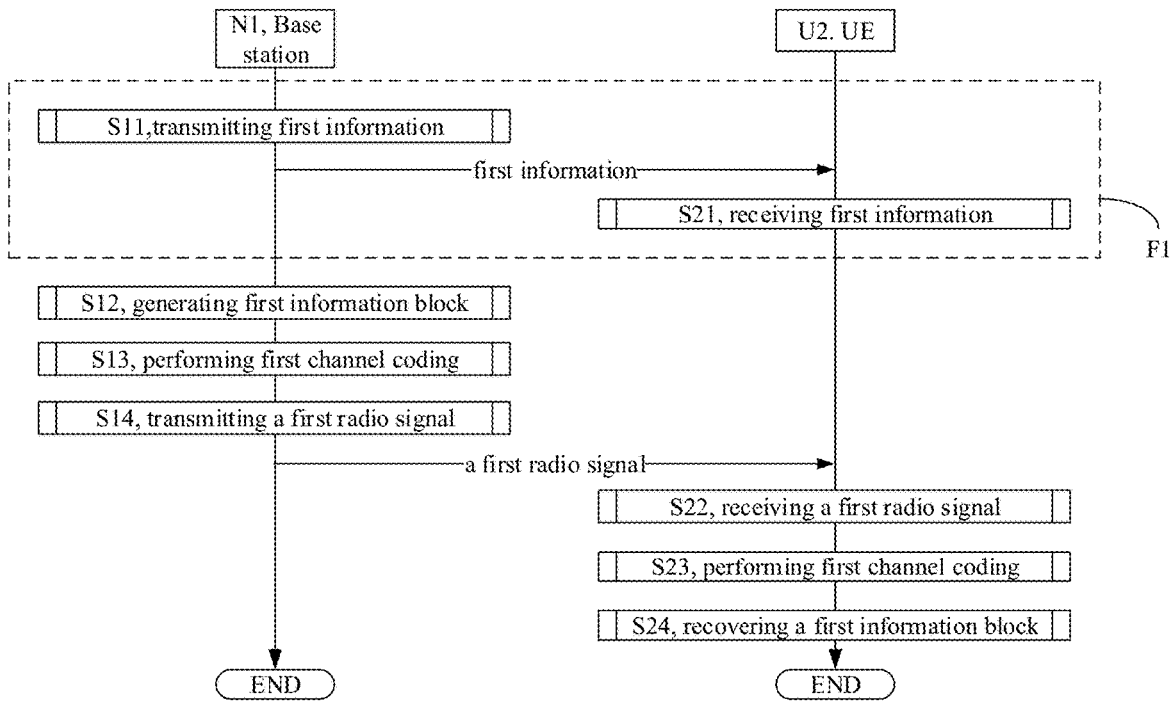
FIG. 5 illustrates a flow chart of transmission of a radio signal according to one embodiment of the present disclosure.

Embodiment 5 illustrates a flow chart of a radio signal transmission according to the present disclosure, as shown in FIG. In FIG. 5, the base station N1 is a maintenance base station of the serving cell of the UE U2. The steps identified in block F1 of the figure are optional.

The base station N1 transmits the first information in step S11, generates the first information block in step S12, performs the first channel coding in step S13, and transmits the first radio signal in step S14.

The UE U2 receives the first information in step S21, receives the first radio signal in step S22, performs the first channel decoding in step S23, and restores the first information block in step S24.

In Embodiment 5, the first information block includes bits in M sub-information-blocks and Q padding bits, where the M is a positive integer greater than one, and the Q is an integer not less than zero; a first bit block is used by N1 for an input of the first channel coding, the first bit block includes bits in the first information block, and the first channel coding is based on a polar code; the first channel decoding corresponds to a first channel coding; the output of the first channel coding is used by N1 to generate the first radio signal; any one of the M sub-information-blocks consists of a positive integer number of bits, the first sub-information-block is a sub-information-block of the M sub-information-blocks; the value of the first sub-information-block is related to the information format of the first information block, or the value of the first sub-information-block is related to the Q; the sequential relationship between the first bit in the first sub-information-block and the first bit in the second sub-information-block in the first information block is related to the number of bits included in the first information block, and the second sub-information-block is a sub-information-block of the M sub-information-blocks.

In a sub-embodiment, the steps exist in block F1, and the first information is used to determine the number of bits included in the first information block.

In a sub-embodiment, the first information block is formed by sequentially cascading the M sub-information-blocks and the Q padding bits.

In a sub-embodiment, the position of the first sub-information-block in the first information block is an optimal position among N candidate positions, where the N is a positive integer greater than 1, correspondingly, the pattern of the bits in the first information block in the first information block is an optimal pattern among N candidate patterns, and the optimal pattern is a candidate pattern among the N candidate patterns meeting the following condition that:

the last bit occupied in the first bit block is front-most.

In a sub-embodiment, the first sub-information-block consists of K bits, at least two of the K bits are non-consecutive in the first information block, and the K is a positive integer greater than 1.

In a sub-embodiment, the first bit block is formed by sequentially cascading a frozen bit block, a first bit sub-block and a second bit sub-block; the first bit sub-block consists of bits in the first sub-information-block, and the second bit sub-block includes bits in the first information bit block except the first sub-information-block.

In a sub-embodiment, the first information block is downlink control information, the information format of the first information block is a downlink control information format of the first information block, and the M sub-information-blocks correspond to M fields in the downlink control information, respectively.

The above sub-embodiments may be arbitrarily combined without conflict.

Embodiment 6

Figure 6:
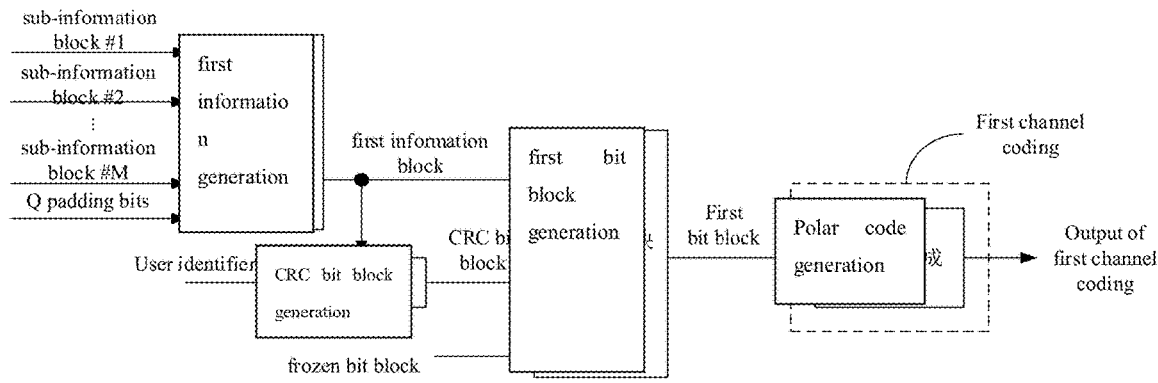
FIG. 6 illustrates a schematic diagram of first channel coding according to one embodiment of the present disclosure.

Embodiment 6 illustrates the first channel coding, as shown in FIG. 6.

In Embodiment 6, the first channel coding includes a polar code generating module, the first bit block is used as an input of the polar code generating module, and an output of the polar code generating module is the output of the first channel coding. The first information block generating module, the CRC bit generating module, and the first bit block generating module are processing modules prior to the first channel coding.

In Embodiment 6, the first information block includes bits in M sub-information-blocks and Q padding bits, and the M sub-information-blocks are sub-information-block #1, sub-information-block #2, . . . sub-information-block # M in FIG. 6, respectively. The first sub-information-block and the second sub-information-block are two sub-information-blocks among the M sub-information-blocks. The value of the first sub-information-block is related to the Q. The sequential relationship between the first bit in the first sub-information-block and the first bit in the second sub-information-block is related to the number of bits included in the first information block. The first information block is used to generate a CRC bit block. An identifier corresponding to the user equipment is used to scramble the CRC bit block. The first information block, the CRC bit block and the frozen bit block are used to generate the first bit block. The CRC bit block includes a positive integer number of CRC bits, and the frozen bit block includes a positive integer number of frozen bits.

In one embodiment, all frozen bits in the frozen bit block are zero.

In one embodiment, all bits in the frozen bit block are consecutive in the first bit block.

In one embodiment, the bits generated after the first information block and the CRC bit block are interleaved referring to Table 5.3.1-1 of The 3rd Generation Partnership Project (3GPP) standard TS38.212 are sequentially mapped into the first bit block.

In one embodiment, the first information block is generated by sequentially cascading sub-information-block #1, sub-information-block #2, . . . sub-information-block # M and Q padding bits, where the Q is greater than zero.

In one embodiment, the Q is equal to 0, and the first information block is generated by sequentially cascading sub-information-block #1, sub-information-block #2, . . . sub-information-block # M.

In one embodiment, the sequential order in which the bits in the first information block are in the first information block is different from the sequential order in which the bits in the first information block are in the first bit block.

In one embodiment, the frozen bit and the padding bit are both zero.

In one embodiment, the length of the first bit block is the Nth power of 2, where the N is a positive integer.

In one embodiment, the polar code generating module multiplies the input bit block and the polar code generation matrix, and uses the multiplication result as an output.

In one embodiment, the polar code generation matrix is a Kronecker matrix.

In one embodiment, if the number of bits included in the first information block is Q1, the first bit of the first sub-information-block is prior to the first bit of the second sub-information-block; if the number of bits included in the first information block is Q2, the first bit of the first sub-information-block is subsequent to the first bit of the second sub-information-block; the Q1 and the Q2 are two different positive integers.

Embodiment 7

Figure 7:
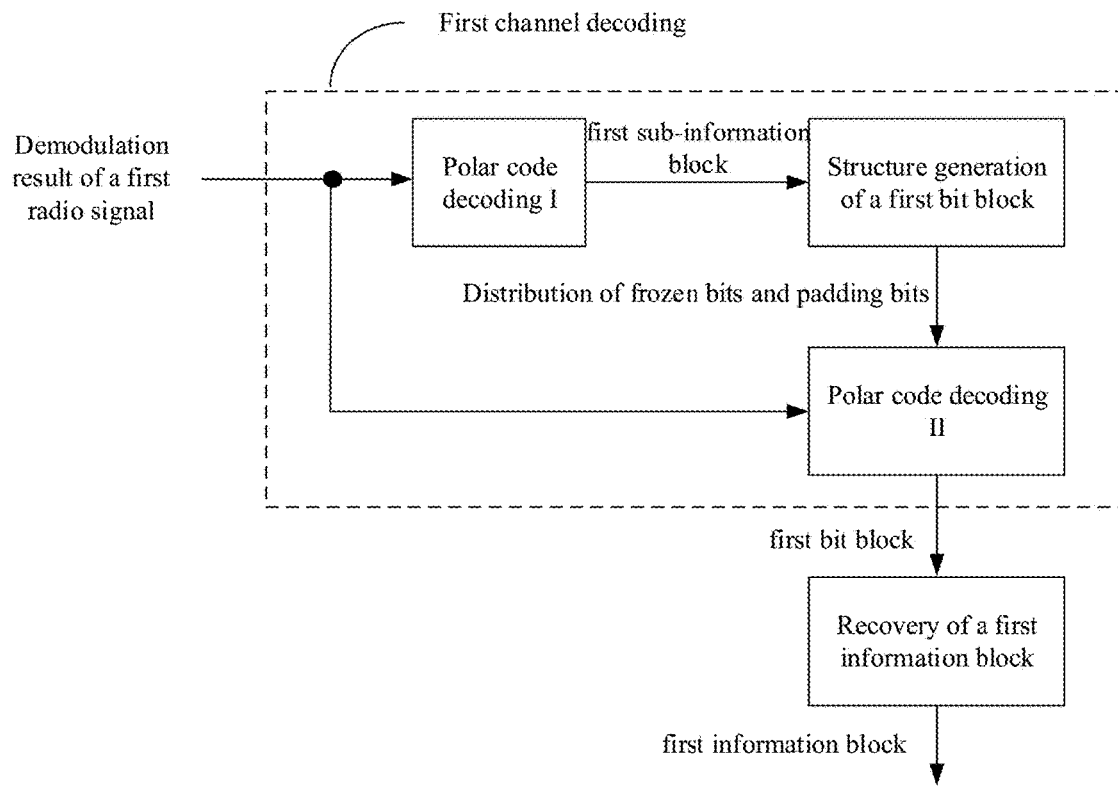
FIG. 7 illustrates a schematic diagram of first channel decoding according to one embodiment of the present disclosure.

Embodiment 7 illustrates the first channel decoding, as shown in FIG. 7.

In Embodiment 7, the first channel decoding includes a polar code decoding I module, a structure generating module of the first bit block, and a polar code decoding II module. The output of the first channel decoding is the first bit block. The first bit block is used by the first block recovering module to generate the first information block.

In embodiment 7, the first bit block is used by a transmitter to generate a first radio signal. The first bit block includes a bit in a first information block, a CRC bit corresponding to the first information block, and a frozen bit. The order in which the bits in the first information block are in the first information block is different from the order in which the bits in the first information block are in the first bit block. The first information block includes bits in M sub-information-blocks and Q padding bits, where the M is a positive integer greater than 1, and the Q is an integer not less than 0. The first sub-information-block is a sub-information-block of the M first sub-information-blocks, the value of the first sub-information-block indicates an information format of the first information block, and the information format of the first information block is used to determine the Q.

In Embodiment 7, the demodulation result of the first radio signal is used for an input of the polar code decoding I module, and the polar code decoding I module is correspondingly used by the transmitter for the polar code generating module of the first bit block. The output of the polar code decoding I module is used to determine the first sub-information-block. The value of the first sub-information-block is used to determine an input of a structure generating module used for the first bit block. In the structure generating module of the first bit block, the value of the first sub-information-block is used to determine the Q, thereby being used to determine the structure of the first bit block, i.e., the position where the frozen bit and the padding bit are located. An output of the structure generating module of the first bit block is used to determine a distribution of the frozen bit and the padding bit, i.e., the structure of the first bit block. The structure of the first bit block and the demodulation result of the first radio signal are used for an input of the polar code decoding II module. The polar code decoding II module corresponds to a polar code generating module used by the transmitter for the first bit block. The frozen bit, the padding bit, and the bit in the first sub-information-block are used as a known bit in the polar code decoding II module. The first information block recovering module extracts and reorders bits corresponding to the first information block from the first bit block to generate the first information block.

Embodiment 8

Figure 8:
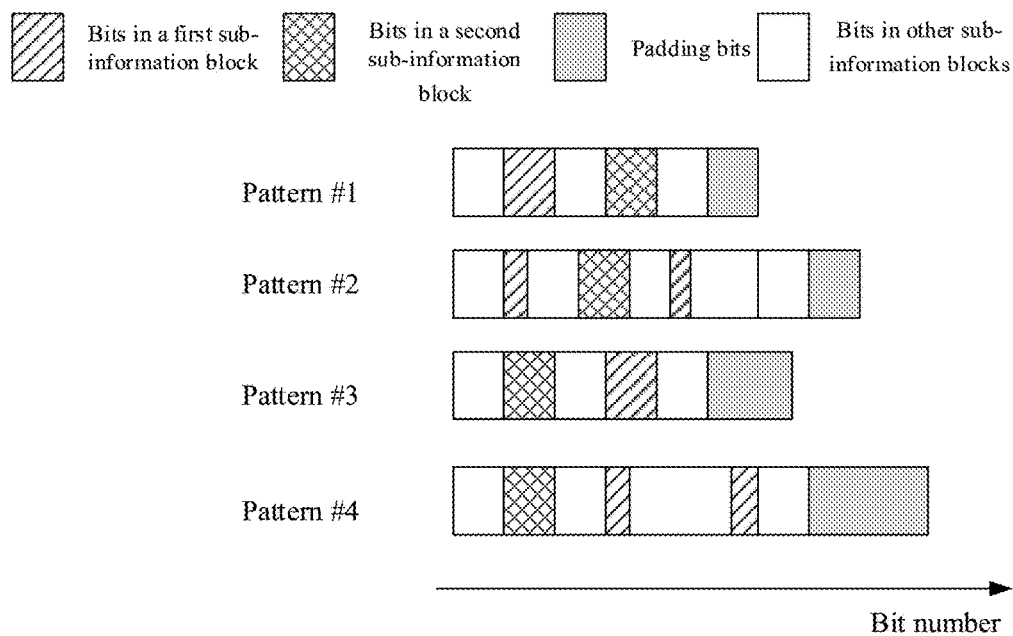
FIG. 8 illustrates a schematic diagram of a first information block according to one embodiment of the present disclosure.

Embodiment 8 illustrates the first information block, as shown in FIG. 8. In FIG. 8, the squares filled with oblique lines are the bits in the first sub-information-block, squares filled with crosses are the bits in the second sub-information-block, squares filled with gray are padding bits, and squares filled with white are the bits in the first information block other than the first sub-information-block and the second sub-information-block.

In Embodiment 8, the first information block includes bits in M sub-information-blocks and Q padding bits, where the M is a positive integer greater than one, and the Q is an integer not less than zero. The first sub-information-block and the second sub-information-block are two sub-information-blocks of the M sub-information-blocks.

In Sub-embodiment 1 of Embodiment 8, bits in the first sub-information-block are consecutive in the first information block. If the number of bits in the first information block is M2, the first sub-information-block is prior to the second sub-information-block, and the bit order of the first information block is as shown by pattern #1 in FIG. 8; if the number of bits in the first information block is M3, the first sub-information-block is subsequent to the second sub-information-block, and the bit order of the first information block is as shown by pattern #3 in FIG. 8; the M2 and the M3 are not equal.

In Sub-embodiment 2 of Embodiment 8, the bits in the first sub-information-block are non-consecutive in the first information block. If the number of bits in the first information block is M4, the first bit of the first sub-information-block is prior to the first bit of the second sub-information-block, and the bit order of the first information block is as shown by pattern #2 in FIG. 8; if the number of bits in the first information block is M5, the first bit of the first sub-information-block is subsequent to the first bit of the second sub-information-block, and the bit order of the first information block is as shown by pattern #4 in FIG. 8.

In Sub-embodiment 3 of Embodiment 8, bits in any one of the sub-information-blocks in the first information block other than the first sub-information-block are consecutive in the first information block.

In Sub-embodiment 4 of Embodiment 8, the sequential relationship of any two sub-information-blocks in the first information block other than the first sub-information-block in the first information block is unrelated to the number of bits in the first information block.

In Sub-embodiment 5 of Embodiment 8, the sequential relationship of at least two sub-information-blocks in the first information block other than the first sub-information-block in the first information block is related to the number of bits in the first information block.

In one embodiment, the M2 and the M3 are a positive integer in the first candidate integer set, respectively, and the first candidate integer set consists of a plurality of positive integers.

In one embodiment, the M4 and the M5 are a positive integer in the first candidate integer set, respectively, and the first candidate integer set consists of a plurality of positive integers.

In one embodiment, the first candidate integer set is fixed (i.e., no downlink signaling configuration is required).

Embodiment 9

Figure 9:
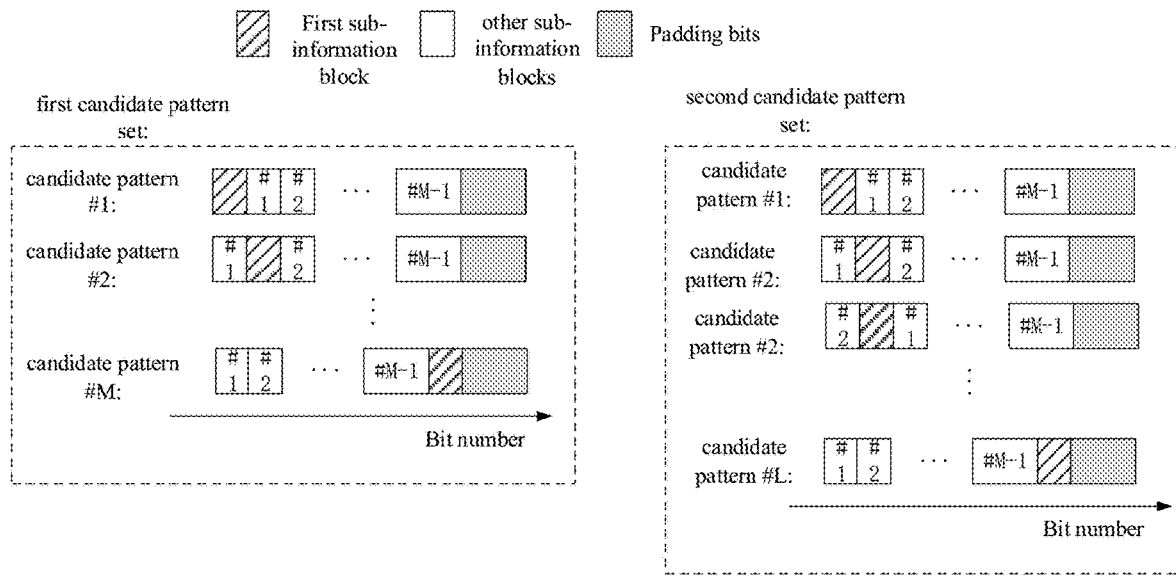
FIG. 9 illustrates a schematic diagram of a candidate pattern according to one embodiment of the present disclosure.

Embodiment 9 illustrates a candidate pattern, as shown in FIG. 9. In FIG. 9, the squares filled with oblique lines are the first sub-information-blocks, squares filled with gray are padding bits, and squares filled with white are other sub-information-blocks other than the first sub-information-block.

In Embodiment 9, the first information block includes M sub-information-blocks and padding bits. The first information block is a sub-information-block of the M sub-information-blocks. One of the first candidate pattern set and the second candidate pattern set is used to select the position of the first sub-information-block in the first information block. In the first candidate pattern set, the sequential order between other M−1 sub-information-blocks other than the first sub-information-block is fixed. Therefore, there are M candidate patterns for traversing. The pattern of bits in the first sub-information-block in the first information block is the optimal pattern among the M candidate patterns. In the second candidate pattern set, the sequential order between other M−1 sub-information-blocks other than the first sub-information-block is also adjustable. Therefore, there are L candidate patterns for traversing. The L is greater than the M. The pattern of bits in the first sub-information-block in the first information block is the optimal pattern among the L candidate patterns.

In one embodiment, the L is a factorial of M.

Embodiment 10

Figure 10:
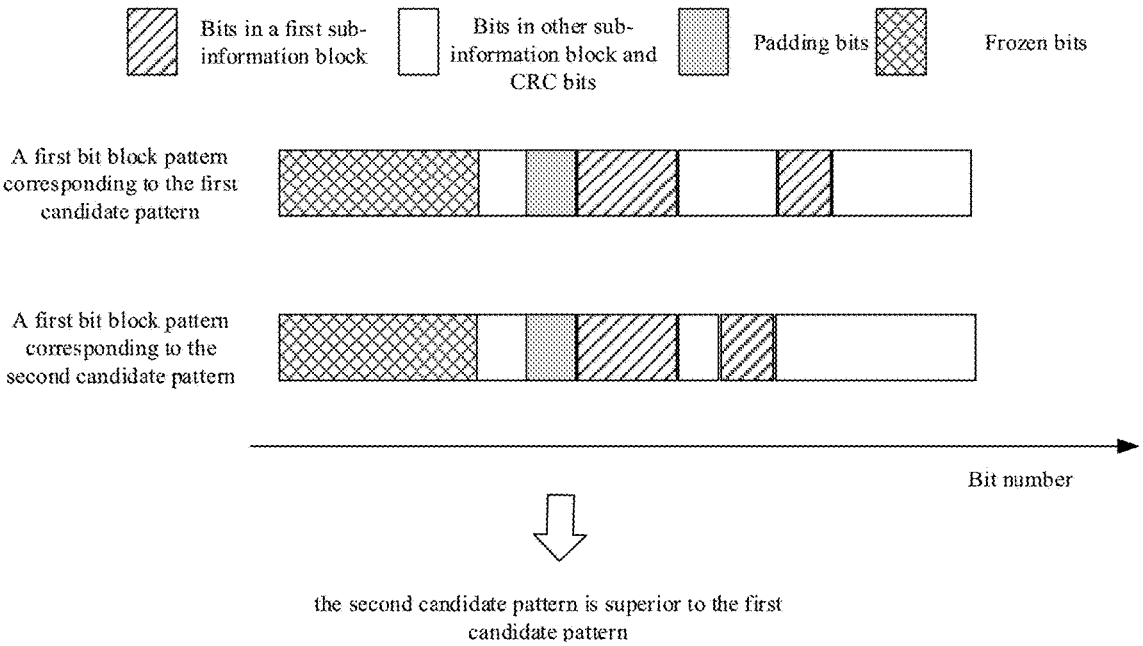
FIG. 10 illustrates a schematic diagram of an optimal pattern according to one embodiment of the present disclosure.

Embodiment 10 illustrates an optimal pattern, as shown in FIG. 10. In FIG. 10, the squares filled with oblique lines are bits in the first sub-information-blocks, squares filled with white are bits in other sub-information-blocks other than the first sub-information-block and CRC bits, squares filled with gray are padding bits, and the squares filled with oblique lines are frozen bits.

In Embodiment 10, the first information block includes M sub-information-blocks and padding bits. The first information block is a sub-information-block of the M sub-information-blocks. The first candidate pattern and the second candidate pattern are two candidate patterns of the M sub-information-blocks in the first information block, respectively, as shown in Embodiment 9. The first bit block includes bits of the first information block, CRC bits generated based on the first information block and frozen bits. The sequential order in which the bits in the first information block are in the first information block is different from the order in which the bits in the first information block are in the first bit block. As shown in FIG. 10, by comparing the pattern of the first bit block corresponding to the first candidate pattern with the pattern of the first bit block corresponding to the second candidate pattern, it can be seen that in the pattern of the first bit block corresponding to the second candidate pattern, the last bit occupied in the first bit block by the bits in the first sub-information-block is more in the front. Therefore, the second candidate pattern is better than the first candidate pattern. Similarly, an optimal candidate pattern among the N candidate patterns of the first information block may be found, where N is a positive integer greater than 1.

Embodiment 11

Figure 11:
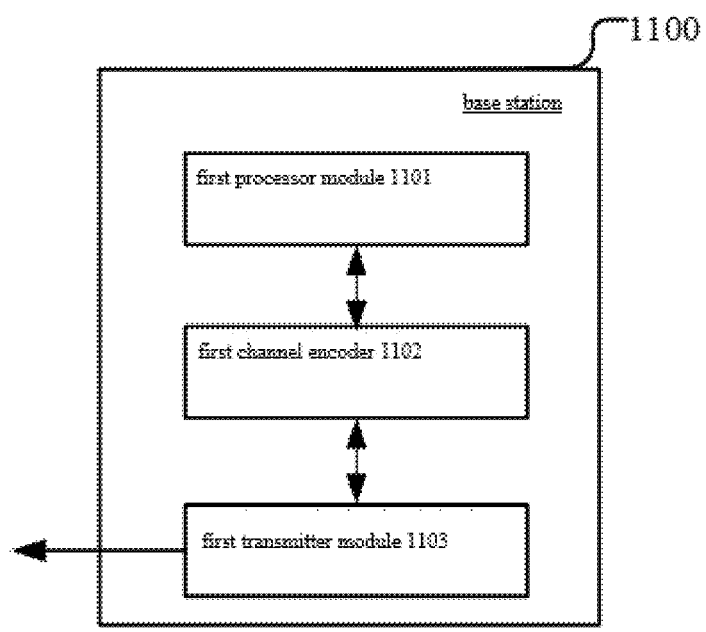
FIG. 11 illustrates a block diagram illustrating the structure of a processing device in a base station according to one embodiment of the present disclosure.

Embodiment 11 illustrates a block diagram illustrating the structure of a processing device in a base station, as shown in FIG. 11. In FIG. 11, the base station processing device 1100 mainly consists of a first processor module 1101, a first channel encoder 1102, and a first transmitter module 1103.

In Embodiment 11, the first processor module 1101 generates a first information block; the first channel encoder 1102 performs first channel coding; and the first transmitter module 1103 transmits a first radio signal.

In Embodiment 11, the first information block includes bits in M sub-information-blocks and Q padding bits, where the M is a positive integer greater than one, and the Q is an integer not less than zero; a first bit block is used for an input of the first channel coding, the first bit block includes bits in the first information block, and the first channel coding is based on a polar code; the output of the first channel coding is used to generate the first radio signal; any one of the M sub-information-blocks consists of a positive integer number of bits, the first sub-information-block is a sub-information-block of the M first sub-information-blocks; the value of the first sub-information-block is related to the information format of the first information block, or the value of the first sub-information-block is related to the Q; the sequential relationship between the first bit in the first sub-information-block and the first bit in the second sub-information-block in the first information block is related to the number of bits included in the first information block, and the second sub-information-block is a sub-information-block of the M sub-information-blocks.

In one embodiment, the first transmitter module 1103 transmits first information; wherein the first information is used to determine the number of bits included in the first information block.

In one embodiment, the first information block is formed by sequentially cascading the M sub-information-blocks and the Q padding bits.

In one embodiment, the position of the first sub-information-block in the first information block is an optimal position among N candidate positions, where the N is a positive integer greater than 1, correspondingly, the pattern of the bits in the first information block in the first information block is an optimal pattern among N candidate patterns, and the optimal pattern is a candidate pattern among the N candidate patterns meeting the following condition that:

the last bit occupied in the first bit block is front-most.

In one embodiment, the first sub-information-block consists of K bits, at least two of the K bits are non-consecutive in the first information block, where the K is a positive integer greater than 1.

In one embodiment, the first bit block is formed by sequentially cascading a frozen bit block, a first bit sub-block and a second bit sub-block; the first bit sub-block consists of bits in the first sub-information-block, and the second bit sub-block includes bits in the first information bit block except the first sub-information-block.

In one embodiment, the first information block is downlink control information, the information format of the first information block is a downlink control information format of the first information block, and the M sub-information-blocks correspond to M fields in the downlink control information, respectively.

In one embodiment, the first processor module 1101 includes the controller/processor 440 in Embodiment 4.

In one embodiment, the first processor module 1101 includes the transmitting processor 415 in Embodiment 4.

In one embodiment, the first channel encoder 1102 includes the transmitting processor 415 in Embodiment 4.

In one embodiment, the first channel encoder 1102 includes the controller/processor 440 in Embodiment 4.

In one embodiment, the first transmitter module 1103 includes the MIMO transmitting processor 441 in Embodiment 4.

In one embodiment, the first transmitter module 1103 includes the transmitter/receiver 416 and the antenna 420 in Embodiment 4.

Embodiment 12

Figure 12:
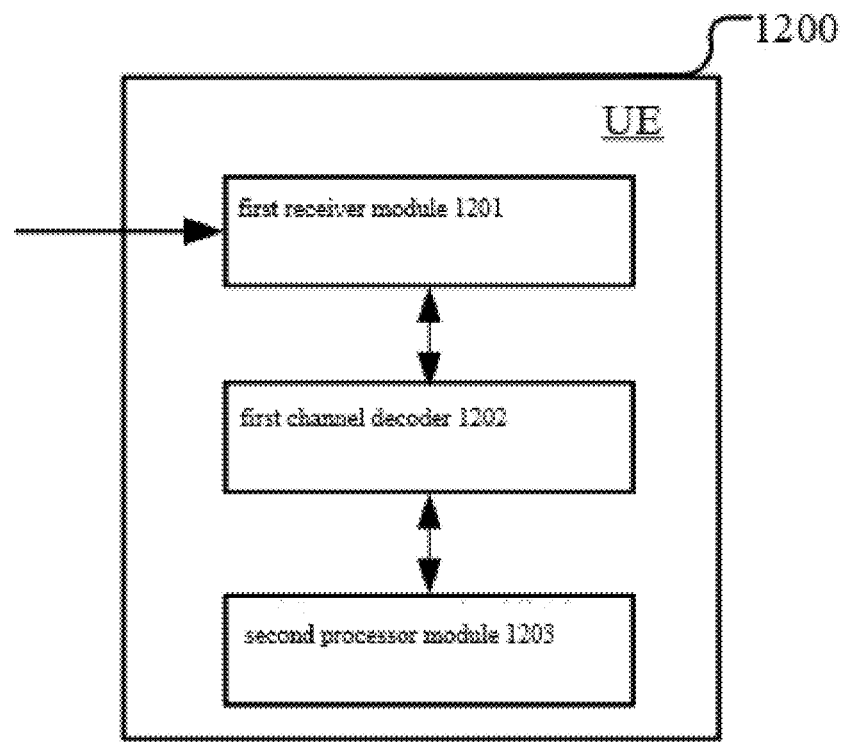
FIG. 12 illustrates a block diagram illustrating the structure of a processing device in a UE according to one embodiment of the present disclosure.

Embodiment 12 illustrates a block diagram illustrating the structure of a processing device in UE, as shown in FIG. 12. In FIG. 12, the UE processing device 1200 mainly consists of a first receiver module 1201, a first channel decoder 1202, and a second processor module 1203.

In Embodiment 12, the first receiver module 1201 receives the first radio signal, the first channel decoder 1202, and the second processor module 1203.

In Embodiment 12, the first radio signal is used for an input of first channel decoding; the first channel decoding corresponds to first channel coding, the first channel coding is based on a polar code, a first bit a block is used for an input of the first channel coding; the first bit block includes bits in the first information block, the first information block includes bits in M sub-information-blocks and Q padding bits, where the M is a positive integer greater than one, and the Q is an integer not less than zero; any one of the M sub-information-blocks consists of a positive integer number of bits, the first sub-information-block is a sub-information-block of the M first sub-information-blocks; the value of the first sub-information-block is related to the information format of the first information block, or the value of the first sub-information-block is related to the Q; the sequential relationship between the first bit in the first sub-information-block and the first bit in the second sub-information-block in the first information block is related to the number of bits included in the first information block, and the second sub-information-block is a sub-information-block of the M sub-information-blocks.

In one embodiment, the first receiver module 1201 receives first information; wherein the first information is used to determine the number of bits included in the first information block.

In one embodiment, the first information block is formed by sequentially cascading the M sub-information-blocks and the Q padding bits.

In one embodiment, the position of the first sub-information-block in the first information block is an optimal position among N candidate positions, where the N is a positive integer greater than 1, correspondingly, the pattern of the bits in the first information block in the first information block is an optimal pattern among N candidate patterns, and the optimal pattern is a candidate pattern among the N candidate patterns meeting the following condition that:

the last bit occupied in the first bit block is front-most.

In one embodiment, the first sub-information-block consists of K bits, at least two of the K bits are non-consecutive in the first information block, where the K is a positive integer greater than 1.

In one embodiment, the first bit block is formed by sequentially cascading a frozen bit block, a first bit sub-block and a second bit sub-block; the first bit sub-block consists of bits in the first sub-information-block, and the second bit sub-block includes bits in the first information bit block except the first sub-information-block.

In one embodiment, the first information block is downlink control information, the information format of the first information block is a downlink control information format of the first information block, and the M sub-information-blocks correspond to M fields in the downlink control information, respectively.

In one embodiment, the second processor module 1203 includes the controller/processor 490 in Embodiment 4.

In one embodiment, the second processor module 1203 includes the memory 480 in Embodiment 4.

In one embodiment, the second processor module 1203 includes the receiving processor 452 in Embodiment 4.

In one embodiment, the first channel decoder 1202 includes the receiving processor 452 in Embodiment 4.

In one embodiment, the first channel decoder 1202 includes the controller/processor 490 in Embodiment 4.

In one embodiment, the first receiver module 1201 includes the MIMO detector 472 in Embodiment 4.

In one embodiment, the first receiver module 1201 includes the transmitter/receiver 456 and the antenna 460 in Embodiment 4.

Embodiment 13

Figure 13:
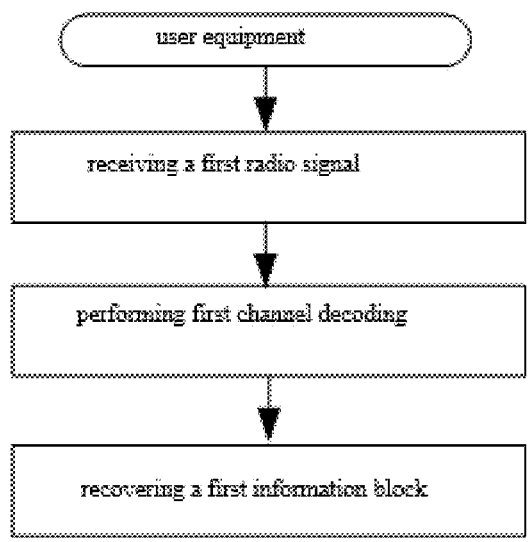
FIG. 13 illustrates a flow chart of a first radio signal, first channel decoding and a first information block according to one embodiment of the present disclosure.

Embodiment 13 illustrates a first radio signal, first channel decoding and a first information block according to the present disclosure, as shown in FIG. 13. In FIG. 13, each box represents a step. In Embodiment 13, the user equipment in the present disclosure sequentially receives a first radio signal, performs first channel decoding, and recovers a first information block; wherein the first radio signal is used for an input of first channel decoding; the first channel decoding corresponds to first channel coding, the first channel coding is based on a polar code, and a first bit block is used for an input of the first channel coding; the first bit block includes bits in the first information block, the first information block includes bits in M sub-information-blocks and Q padding bits, where the M is a positive integer greater than one, and the Q is an integer not less than zero; any one of the M sub-information-blocks consists of a positive integer number of bits, the first sub-information-block is a sub-information-block of the M first sub-information-blocks; the value of the first sub-information-block is related to the information format of the first information block, or the value of the first sub-information-block is related to the Q; the sequential relationship between the first bit in the first sub-information-block and the first bit in the second sub-information-block in the first information block is related to the number of bits included in the first information block, and the second sub-information-block is a sub-information-block of the M sub-information-blocks.

In one embodiment, the first information block is a DCI block.

In one embodiment, a PDCCH is used to transmit the first information block.

In one embodiment, the first sub-information-block indicates an information format of the first information block, and the information format of the first information block is used to determine the Q.

In one embodiment, the sequential order in which the bits in the first information block are in the first information block is different from the sequential order in which the bits in the first information block are in the first bit block.

In one embodiment, if the number of bits included in the first information block is Q1, the first bit of the first sub-information-block is prior to the first bit of the second sub-information-block; if the number of bits included in the first information block is Q2, the first bit of the first sub-information-block is subsequent to the first bit of the second sub-information-block; the Q1 and the Q2 are two different positive integers.

In one embodiment, the second sub-information-block indicates time-frequency resource information occupied by the downlink transmission.

In one embodiment, the second sub-information-block indicates time-frequency resource information occupied by the uplink transmission.

Embodiment 14

Figure 14:
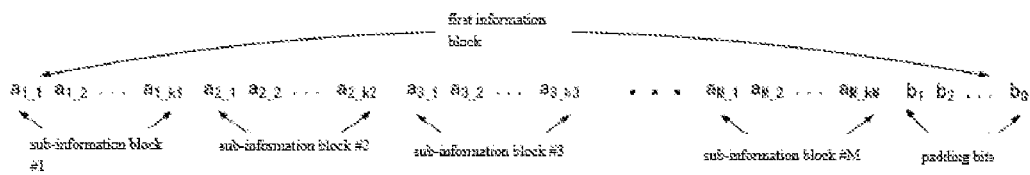
FIG. 14 illustrates a schematic diagram of a first information block according to one embodiment of the present disclosure.

Embodiment 14 illustrates a schematic diagram of a first information block according to the present disclosure, as shown in FIG. 14. In FIG. 14, the first information block is formed by sequentially cascading M sub-information-blocks (i.e., sub-information-block #1, sub-information-block #2, . . . , sub-information-block # M) and Q padding bits; the sub-information-block #1, the sub-information-block #2, . . . , the sub-information-block # M correspond to the bit sequence $\{a_{1\_1}\ a_{1\_2} \ldots a_{1\_k1}\}$, $\{a_{2\_1}\ a_{2\_2} \ldots a_{2\_k2}\}$, . . . , $\{a_{M\_1}\ a_{M\_2} \ldots a_{M\_kM}\}$, respectively; the padding bits are the bit sequence $\{b1\ b2 \ldots bQ\}$, and the total number of bits in the M sub-information-blocks is equal to the sum of k1, k2, . . . , kM.

In Sub-embodiment 1 of Embodiment 14, if the number of bits in the first information block (i.e., the sum of k1, k2, . . . , kM, and Q) is M2, the first sub-information-block is sub-information-block #i; if the number of bits in the first information block is M3, the first sub-information-block is sub-information-block #j; the M2 and the M3 are not equal, the i and the j are not equal, and i and j are positive integers not greater than M, respectively.

In Sub-embodiment 2 of the embodiment 14, the sequential relationship of any two sub-information-blocks in the first information block other than the first sub-information-block in the first information block is unrelated to the number of bits in the first information block.

In Sub-embodiment 3 of Embodiment 14, the sequential relationship of at least two sub-information-blocks in the first information block other than the first sub-information-block in the first information block is related to the number of bits in the first information block.

In Sub-embodiment 4 of Embodiment 14, the meaning of at least one of the M sub-information-blocks is related to the number of bits in the first information block.

In Sub-embodiment 5 of Embodiment 14, the M is related to the number of bits in the first information block.

In Sub-embodiment 6 of Embodiment 14, the first information block is a DCI, and the M sub-information-blocks correspond to M fields in the DCI, respectively.

In one embodiment, the meaning of the M sub-information-blocks is related to the DCI format corresponding to the first information block.

In one embodiment, the M fields include one or more of the following fields:

Resource Allocation;
Modulation coding Status (MCS);
Carrier Indicator Field (CIF);
Transmission Power Control (TPC);
Hybrid Automatic Repeat Request (HARQ) Process Number;
Redundancy Version (RV);
New Data Indicator (NDI);
Bandwidth Part (BWP) indication;
Sounding Reference Signal Resource Indicator (SRI);
Transmission Precoding Matrix Indicator (TPMI);
Aperiodic Channel Status Information (A-CSI) trigger;
Aperiodic Sounding Reference Signal (A-SRS) trigger;
Demodulation Reference Signal (DMRS) configuration information.

Embodiment 15

Figure 15:
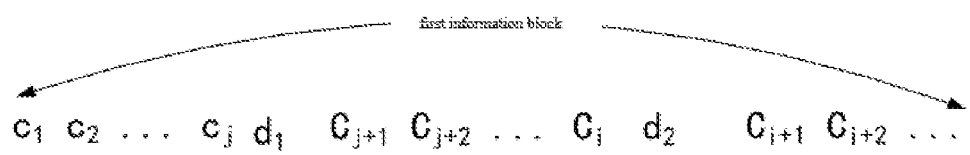
FIG. 15 illustrates a schematic diagram of a first information block according to still another embodiment of the present disclosure.

Embodiment 15 illustrates a schematic diagram of a first information block according to the present disclosure, as shown in FIG. 15. In FIG. 15, the first information block consists of bit sequences $\{c_1\ c_2 \ldots c_j\ d_1\ c_{j+1}\ c_{j+2} \ldots c_i\ d_2\ c_{i+1}\ c_{i+2} \ldots \}$, where bits $d_1\ d_2 \ldots$ are non-consecutive.

In Sub-embodiment 1 of Embodiment 15, the bits $d_1\ d_2 \ldots$ constitute the first sub-information-block in the first bit block.

In Sub-embodiment 2 of Embodiment 15, in Sub-embodiment 1 of Embodiment 15, the bits $d_1\ d_2 \ldots$ are padding bits in the first bit block.

Embodiment 16

Figure 16:
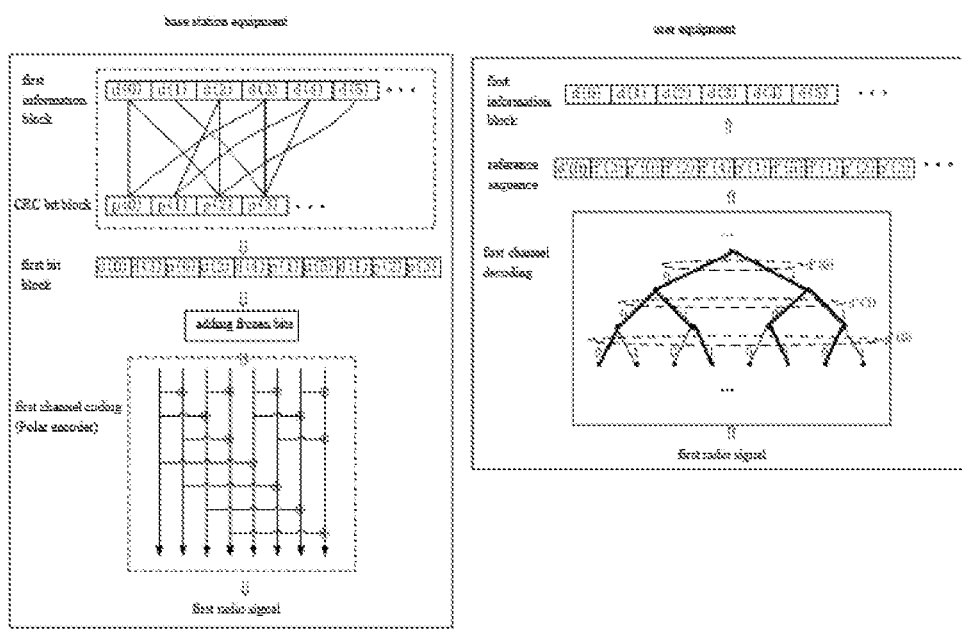
FIG. 16 illustrates a schematic diagram of first channel coding and first channel decoding according to one embodiment of the present disclosure.

Embodiment 16 illustrates a schematic diagram of first channel coding and first channel decoding, as shown in FIG. 16.

In Embodiment 16, in the base station equipment, the bits $d(1)\ d(2)\ d(3)\ d(4)\ d(5) \ldots$ in the first information block are used to generate bits in the CRC bit blocks $p(1)\ p(2)\ d(3) \ldots$, the bits in the first information block and the CRC bit block are interleaved to obtain a first bit block, the first bit block is used as an input of first channel coding after adding frozen bits, the output of the channel coding is used to generate the first radio signal, and the channel coding is based on a polar code. At least a portion of the bits in the CRC bit block are distributed (i.e., non-consecutive) in the first bit block.

In the user equipment, the received first radio signal is used to generate an input of the first channel decoding, and the first channel decoding is based on the first channel coding. The output of the first channel decoding is a reference sequence, and the reference sequence and the bits in the first bit block are in one-to-one correspondence.

In FIG. 16, the bits in the first information block are represented by d(i), where i is an integer greater than or equal to 0; the bits in the CRC bit block are represented by p(j), where j is an integer greater than or equal to 0. The bits in the first information block and the associated bits in the CRC bit block are connected by a solid line. The tree diagram in the decoder represents a portion of the path associated with the bits $\{d(0), d(3), p(0)\}$ in the channel decoding, and the position of the bits $\{d(0), d(3), p(0)\}$ in the first bit block is consecutive.

In one embodiment, the first channel decoding is based on Viterbi criteria, and the reference value corresponding to at least one CRC bit is used for pruning in the first channel decoding.

In one embodiment, the CRC bit block includes 24 bits, in which 8 bits are non-consecutive.

In one embodiment, the first information block includes bits in the first sub-information-block, the first bit block includes Q padding bits, where the Q is a positive integer; in the first channel decoding, the user equipment determines an element corresponding to bits in the first sub-information-block in the reference sequence first before obtaining an element corresponding to Q1 padding bits in the reference sequence, determines a value of the Q1 padding bits according to the element corresponding to bits in the first sub-information-block in the reference sequence, and performs a subsequent decoding operation using the Q1 padding bits as frozen bits, where the Q1 padding bits are a subset of the Q padding bits.

In one embodiment, the Q1 is equal to the Q.

In one embodiment, the Q1 is smaller than the Q, and the padding bits in the Q padding bits other than the Q1 padding bits are decoded prior to the first sub-information-block.

In one embodiment, the value of each element in the reference sequence is a Log Likelihood Ratio (LLR) estimated for the corresponding (transmitted) bits.

In one embodiment, an element corresponding to the Q1 padding bits in the reference sequence is 0; the value of each element in the reference sequence is a Log Likelihood Ratio (LLR) estimated for the corresponding (transmitted) bits, except the element corresponding to the Q1 padding bits.

In one embodiment, the first radio signal is an output subsequently to being subjected to scrambling, a modulation mapper, a layer mapper, precoding, resource element mapper, and wideband symbol generation sequentially after the first bit block is added with frozen bits.

In one embodiment, the first radio signal is an output subsequently to being subjected to scrambling, a modulation mapper, a layer mapper, a transform precoder (which is configured to generate a complex value signal), precoding, resource element mapper, and wideband symbol generation sequentially after the first bit block is added with frozen bits.

In one embodiment, the CRC bit block is an output of the first information block subjected to a CRC cyclic generator polynomial.

In one embodiment, the CRC bit block is an output after the first information block is subjected to a CRC cyclic generator polynomial and scrambling.

In one embodiment, the polynomial formed by the first information block and the CRC bit block prior to scrambling can be divisible by the CRC cyclic generator polynomial on the GF(2), that is, the remainder obtained by dividing the polynomial formed by the first information block and the CRC bit block prior to scrambling by the CRC cyclic generator polynomial is zero.

In one embodiment, the first channel coding includes rate matching.

In one embodiment, the pruning is used to reduce surviving search paths in the channel decoding based on Viterbi criteria. For example, in the tree diagram of FIG. 16, the paths indicated by thick solid lines are the surviving search paths, and the other paths are the search paths that are deleted.

In one embodiment, in the first bit block, bits in the first information block corresponding to the pruned search paths precede the associated CRC bits. For example, in FIG. 16, the reference value corresponding to p(0) is denoted by p'(0) in FIG. 16, and is used for pruning in the channel decoding. The bits corresponding to the pruned search paths are d(0) and d(3). The positions of d(0) and d(3) in the third bit block are precede p(0).

The ordinary skill in the art may understand that all or part steps in the above method may be implemented by instructing related hardware through a program. The program may be stored in a computer-readable storage medium, for example Read-Only Memory (ROM), hard disk or compact disc, etc. Optionally, all or part steps in the above embodiments also may be implemented by one or more integrated circuits. Correspondingly, each module unit in the above embodiment may be realized in the form of hardware, or in the form of software function modules. The present disclosure is not limited to any combination of hardware and software in specific forms. The UE and terminal in the present disclosure include but not limited to mobile phones, unmanned aerial vehicles with a communication module, aircrafts with a communication module, cars with a communication module, tablet computers, notebooks, network cards, narrowband Internet of Things (NB-IOT) terminals, eMTC terminals, and other wireless communication devices. The base station or system equipment in the present disclosure includes but not limited to gNB, macro-cellular base stations, micro-cellular base stations, home base stations, relay base stations, and other wireless communication devices.

The above are merely the preferred embodiments of the present disclosure and are not intended to limit the scope of protection of the present disclosure. Any modification, equivalent substitute and improvement made within the spirit and principle of the present disclosure are intended to be included within the scope of protection of the present disclosure.

What is claimed is:

1. A method in base station equipment for wireless communication, comprising:
   generating, by a first processor module, a first information block comprising bits in M sub-information-blocks and Q padding bits, where the M is a positive integer greater than one, and the Q is an integer not less than zero;
   performing, by a first channel encoder, first channel coding, wherein a first bit block is used for an input of the first channel coding, the first bit block comprises bits in the first information block, and the first channel coding is based on a polar code;
   transmitting, by a first transmitter module, a first radio signal, wherein the output of the first channel coding is used to generate the first radio signal;
   wherein any one of the M sub-information-blocks consists of a positive integer number of bits, a first sub-information-block is a sub-information-block of the M sub-information-blocks; the value of the first sub-information-block is related to the information format of the first information block, or the value of the first sub-information-block is related to the Q; the sequential relationship between the first bit in the first sub-information-block and the first bit in a second sub-information-block in the first information block is related to the number of bits included in the first information block, and the second sub-information-block is a sub-information-block of the M sub-information-blocks.

2. The method according to claim 1, comprising:
   transmitting first information;
   wherein the first information is used to determine the number of bits included in the first information block.

3. The method according to claim 1 or 2, wherein the first information block is formed by sequentially cascading the M sub-information-blocks and the Q padding bits.

4. The method according to claim 3, wherein the position of the first sub-information-block in the first information block is an optimal position among N candidate positions, where the N is a positive integer greater than 1, correspondingly, the pattern of the bits in the first information block in the first information block is an optimal pattern among N candidate patterns, and the optimal pattern is a candidate pattern among the N candidate patterns meeting the following condition that:
   the last bit occupied in the first bit block is front-most.

5. The method according to claim 1 or 2, wherein the first sub-information-block consists of K bits, at least two of the K bits are non-consecutive in the first information block, the K is a positive integer greater than 1, or the first bit block is formed by sequentially cascading a frozen bit block, a first bit sub-block and a second bit subblock; the first bit sub-block consists of bits in the first sub-information-block, the second bit sub-block comprises bits in the first information bit block except the first sub-information-block, or the first information block is downlink control information, the information format of the first information block is a downlink control information format of the first information block, and the M sub-information-blocks correspond to M fields in the downlink control information, respectively.

6. A method in user equipment for wireless communication, comprising:
receiving, by a first receiver module, a first radio signal, wherein the first radio signal is used for an input of first channel decoding;
performing, by a first channel decoder, first channel decoding, wherein the first channel decoding corresponds to first channel coding, the first channel coding is based on a polar code, and a first bit block is used for an input of the first channel coding;
recovering, by a second processor module, a first information block, wherein the first bit block comprises bits in the first information block, the first information block comprises bits in M sub-information-blocks and Q padding bits, where the M is a positive integer greater than one, and the Q is an integer not less than zero;
wherein any one of the M sub-information-blocks consists of a positive integer number of bits, a first sub-information-block is a sub-information-block of the M sub-information-blocks; the value of the first sub-information-block is related to the information format of the first information block, or the value of the first sub-information-block is related to the Q; the sequential relationship between the first bit in the first sub-information-block and the first bit in a second sub-information-block in the first information block is related to the number of bits included in the first information block, and the second sub-information-block is a sub-information-block of the M sub-information-blocks.

7. The method according to claim 6 comprising:
receiving first information;
wherein the first information is used to determine the number of bits included in the first information block.

8. The method according to claim 6, wherein the first information block is formed by sequentially cascading the M sub-information-blocks and the Q padding bits.

9. The method according to claim 8, wherein the position of the first sub-information-block in the first information block is an optimal position among N candidate positions, where the N is a positive integer greater than 1, correspondingly, the pattern of the bits in the first information block in the first information block is an optimal pattern among N candidate patterns, and the optimal pattern is a candidate pattern among the N candidate patterns meeting the following condition that:
the last bit occupied in the first bit block is front-most.

10. The method according to claim 6, wherein the first sub-information-block consists of K bits, at least two of the K bits are non-consecutive in the first information block, the K is a positive integer greater than 1, or the first bit sub-block consists of bits in the first sub-information-block, the second bit sub-block comprises bits in the first information bit block except the first sub-information-block, or the first information block is downlink control information, the information format of the first information block is a downlink control information format of the first information block, and the M sub-information-blocks correspond to M fields in the downlink control information, respectively.

11. Base station equipment for wireless communication, comprising:
a first processor module configured to generate a first information block comprising bits in M sub-information-blocks and Q padding bits, where the M is a positive integer greater than one, and the Q is an integer not less than zero;
a first channel encoder configured to perform first channel coding, wherein a first bit block is used for an input of the first channel coding, the first bit block comprises bits in the first information block, and the first channel coding is based on a polar code;
a first transmitter module configured to transmit a first radio signal, wherein the output of the first channel coding is used to generate the first radio signal;
wherein any one of the M sub-information-blocks consists of a positive integer number of bits, a first sub-information-block is a sub-information-block of the M sub-information-blocks; the value of the first sub-information-block is related to the information format of the first information block, or the value of the first sub-information-block is related to the Q; the sequential relationship between the first bit in the first sub-information-block and the first bit in a second sub-information-block in the first information block is related to the number of bits included in the first information block, and the second sub-information-block is a sub-information-block of the M sub-information-blocks.

12. The method according to claim 11, wherein the first transmitter module transmits first information; wherein the first information is used to determine the number of bits included in the first information block.

13. The method according to claim 11, wherein the first information block is formed by sequentially cascading the M sub-information-blocks and the Q padding bits.

14. The method according to claim 13, wherein the position of the first sub-information-block in the first information block is an optimal position among N candidate positions, where the N is a positive integer greater than 1, correspondingly, the pattern of the bits in the first information block in the first information block is an optimal pattern among N candidate patterns, and the optimal pattern is a candidate pattern among the N candidate patterns meeting the following condition that:
the last bit occupied in the first bit block is front-most.

15. The method according to claim 11, wherein the first sub-information-block consists of K bits, at least two of the K bits are non-consecutive in the first information block, the K is a positive integer greater than 1, or the first bit block is formed by sequentially cascading a frozen bit block, a first bit sub-block and a second bit sub-block; the first bit sub-block consists of bits in the first sub-information-block, the second bit sub-block comprises bits in the first information bit block except the first sub-information-block, or the first information block is downlink control information, the information format of the first information block is a downlink control information format of the first information block, and the M sub-information-blocks correspond to M fields in the downlink control information, respectively.

16. User equipment for wireless communication, comprising:
a first receiver module configured to receive a first radio signal, wherein the first radio signal is used for an input of first channel decoding;
a first channel decoder configured to perform first channel decoding, wherein the first channel decoding corresponds to first channel coding, the first channel coding is based on a polar code, and a first bit block is used for an input of the first channel coding;
a second processor module configured to recover a first information block, wherein the first bit block comprises bits in the first information block, the first information block comprises bits in M sub-information-blocks and Q padding bits, where the M is a positive integer greater than one, and the Q is an integer not less than zero;

wherein any one of the M sub-information-blocks consists of a positive integer number of bits, a first sub-information-block is a sub-information-block of the M sub-information-blocks; the value of the first sub-information-block is related to the information format of the first information block, or the value of the first sub-information-block is related to the Q; the sequential relationship between the first bit in the first sub-information-block and the first bit in a second sub-information-block in the first information block is related to the number of bits included in the first information block, and the second sub-information-block is a sub-information-block of the M sub-information-blocks.

17. The method according to claim 16, wherein the first receiver module receives first information; wherein the first information is used to determine the number of bits included in the first information block.

18. The method according to claim 16, wherein the first information block is formed by sequentially cascading the M sub-information-blocks and the Q padding bits.

19. The method according to claim 18, wherein the position of the first sub-information-block in the first information block is an optimal position among N candidate positions, where the N is a positive integer greater than 1, correspondingly, the pattern of the bits in the first information block in the first information block is an optimal pattern among N candidate patterns, and the optimal pattern is a candidate pattern among the N candidate patterns meeting the following condition that:

the last bit occupied in the first bit block is front-most.

20. The method according to claim 16, wherein the first sub-information-block consists of K bits, at least two of the K bits are non-consecutive in the first information block, the K is a positive integer greater than 1, or the first bit sub-block consists of bits in the first sub-information-block, the second bit sub-block comprises bits in the first information bit block except the first sub-information-block, or the first information block is downlink control information, the information format of the first information block is a downlink control information format of the first information block, and the M sub-information-blocks correspond to M fields in the downlink control information, respectively.

* * * * *